(12) United States Patent
Kim et al.

(10) Patent No.: US 12,283,580 B2
(45) Date of Patent: Apr. 22, 2025

(54) DISPLAY DEVICE HAVING INSULATING PATTERN WITH CONCAVE-CONVEX PATTERN

(71) Applicant: Samsung Display Co., LTD., Yongin-si (KR)

(72) Inventors: Eun Ju Kim, Suwon-si (KR); Yun Mi Choi, Yongin-si (KR); Jun Yong Kim, Bucheon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 649 days.

(21) Appl. No.: 17/441,988

(22) PCT Filed: Feb. 5, 2020

(86) PCT No.: PCT/KR2020/001658
§ 371 (c)(1),
(2) Date: Sep. 22, 2021

(87) PCT Pub. No.: WO2020/197080
PCT Pub. Date: Oct. 1, 2020

(65) Prior Publication Data
US 2022/0223575 A1    Jul. 14, 2022

(30) Foreign Application Priority Data
Mar. 28, 2019 (KR) .................. 10-2019-0035948

(51) Int. Cl.
*H01L 25/16* (2023.01)
*H01L 33/58* (2010.01)
(Continued)

(52) U.S. Cl.
CPC ............ *H01L 25/167* (2013.01); *H01L 33/58* (2013.01); *H01L 24/24* (2013.01); *H01L 24/25* (2013.01);
(Continued)

(58) Field of Classification Search
CPC .................. H01L 25/167; H01L 33/58; G09G 2300/0456; H05B 33/24
See application file for complete search history.

(56) References Cited

U.S. PATENT DOCUMENTS

2014/0319560 A1  10/2014  Tischler
2017/0062679 A1   3/2017  Lee et al.
(Continued)

FOREIGN PATENT DOCUMENTS

JP    2013-533644      8/2013
KR    10-2011-0130853  12/2011
(Continued)

OTHER PUBLICATIONS

International Search Report, with English translation, corresponding to International Applicaion No. PCT/KR2020/001658 dated May 21, 2020.
(Continued)

*Primary Examiner* — Jay C Chang
*Assistant Examiner* — Mikka Liu
(74) *Attorney, Agent, or Firm* — KILE PARK REED & HOUTTEMAN PLLC

(57) ABSTRACT

A display device and a method for manufacturing same are provided. A display device comprises: a first electrode; a second electrode arranged to be spaced apart from and face the first electrode; a first insulation pattern having at least partial region arranged to overlap the first electrode and having a first side surface spaced apart from a first end portion of the first electrode; a second insulation pattern having at least a partial region arranged to overlap the second electrode and having a second side surface spaced apart from a second end portion of the second electrode facing the first end portion, the second side surface facing the first side surface; at least one uneven pattern provided on (Continued)

the first insulation pattern and the second insulation pattern; and at least one light-emitting element provided between the first insulation pattern and the second insulation pattern and having opposite end portions that are electrically connected to the first electrode and the second electrode, respectively.

23 Claims, 34 Drawing Sheets

(51) Int. Cl.
    *H01L 23/00*     (2006.01)
    *H01L 33/20*     (2010.01)
    *H01L 33/52*     (2010.01)

(52) U.S. Cl.
    CPC .............. *H01L 33/20* (2013.01); *H01L 33/52* (2013.01); *H01L 2224/24051* (2013.01); *H01L 2224/24147* (2013.01); *H01L 2224/245* (2013.01); *H01L 2224/25175* (2013.01); *H01L 2924/01013* (2013.01); *H01L 2924/0549* (2013.01); *H01L 2933/005* (2013.01); *H01L 2933/0058* (2013.01)

(56) References Cited

U.S. PATENT DOCUMENTS

| | | | |
|---|---|---|---|
| 2017/0276947 A1 | 9/2017 | Yokoyama | |
| 2018/0012876 A1* | 1/2018 | Kim | ........................ H01L 27/124 |
| 2018/0019369 A1* | 1/2018 | Cho | ........................ H01L 27/156 |

FOREIGN PATENT DOCUMENTS

| | | |
|---|---|---|
| KR | 10-2012-0114975 | 10/2012 |
| KR | 10-2018-0007025 | 1/2018 |
| KR | 10-2018-0007376 | 1/2018 |
| KR | 10-2018-0071465 | 6/2018 |
| KR | 10-2018-0072909 | 7/2018 |
| KR | 10-2018-0082667 | 7/2018 |
| KR | 10-2019-0016173 | 2/2019 |

OTHER PUBLICATIONS

Written Opinion, with English translation, corresponding to International Application No. PCT/KR2020/001658, dated May 21, 2020.

Extended European Search Report for European Patent Application No./Patent No. 20778709.4 dated Nov. 28, 2022.

* cited by examiner

FIG. 6
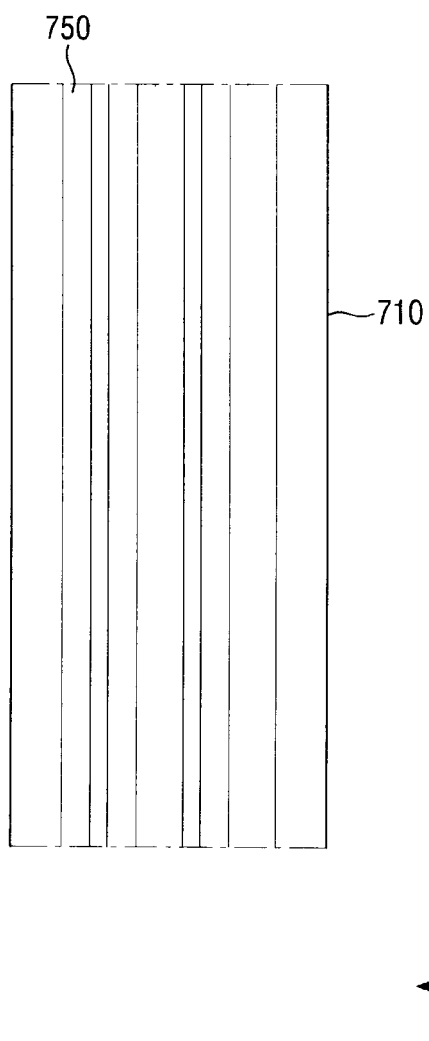
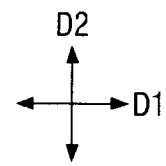

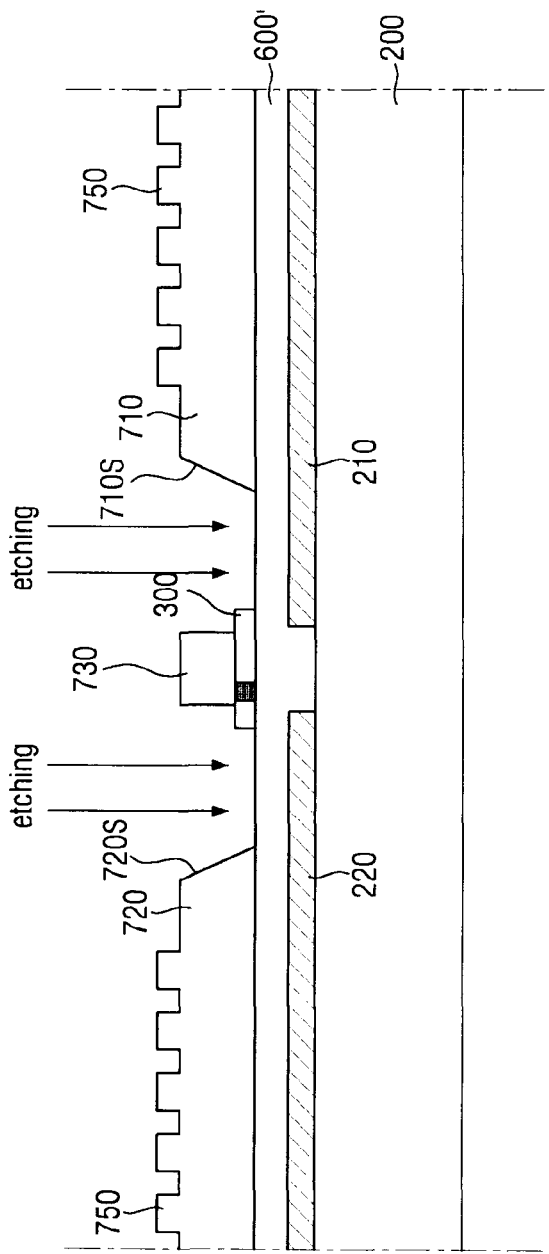

FIG. 20
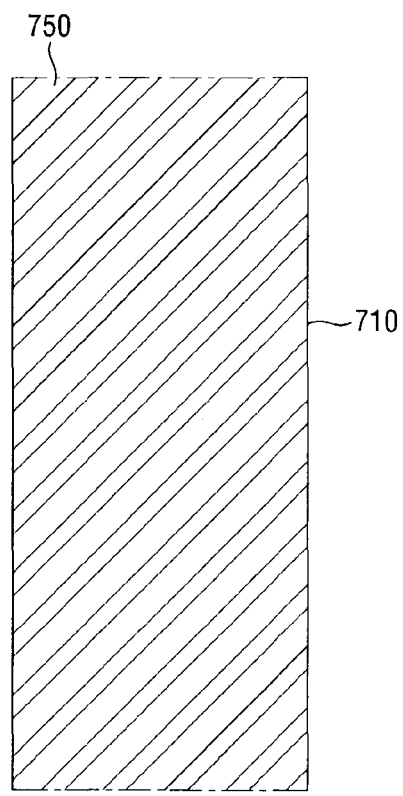
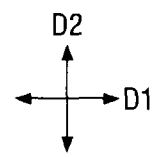

DISPLAY DEVICE HAVING INSULATING PATTERN WITH CONCAVE-CONVEX PATTERN

CROSS-REFERENCE TO RELATED APPLICATIONS

This application is a national entry of International Application No. PCT/KR2020/001658, filed on Feb. 5, 2020, which claims under 35 U.S.C. §§ 119(a) and 365(b) priority to and benefits of Korean Patent Application No. 10-2019-0035948 filed on Mar. 28, 2019, in the Korean Intellectual Property Office (KIPO), the entire contents of which are incorporated herein by reference.

BACKGROUND

1. Technical Field

The disclosure relates to a display device and a method for manufacturing the same.

2. Description of Related Art

The importance of display devices is increasing with the development of multimedia. Accordingly, various types of display devices such as organic light-emitting display (OLED) devices and liquid crystal display (LCD) devices are being used.

A display panel such as an OLED panel or an LCD panel is a device included in a display device to display an image. Among such display panels, a light-emitting element may be provided as a light-emitting display panel, and examples of a light-emitting diode (LED) include an organic LED (OLED) using an organic material as a fluorescent material and an inorganic LED using an inorganic material as a fluorescent material.

An inorganic LED using an inorganic semiconductor as a fluorescent material has durability even in a high-temperature environment and has higher efficiency in blue light compared to the organic LED. In a manufacturing process pointed out as a limit of an existing inorganic LED element, a transfer method using a dielectrophoresis (DEP) method has been developed. Accordingly, research is being continuously conducted on the inorganic light-emitting diode having higher durability and efficiency than those of the organic light-emitting diode.

SUMMARY

Aspects of the disclosure provide a display device including a concave-convex pattern for emitting light emitted from a light emitting element upwards.

Aspects of the disclosure also provide a manufacturing process for a display device in which the device includes the concave-convex pattern such that a reflective member that reflects light emitted from a light emitting element is omitted, thereby reducing a manufacturing process of the device.

It should be noted that aspects of the disclosure are not limited thereto and other aspects, which are not mentioned herein, will be apparent to those of ordinary skill in the art from the following description.

According to an embodiment of the disclosure, a display device may comprise a first electrode, a second electrode spaced apart from the first electrode, a first insulating pattern disposed on the first electrode, at least partially overlapping the first electrode, and including a first side spaced apart from a first end of the first electrode, a second insulating pattern disposed on the second electrode and at least partially overlapping the second electrode and including a second side facing the first side spaced apart from an end of the second electrode facing the first end of the first electrode, at least one concave-convex pattern disposed on each of the first insulating pattern and the second insulating pattern, and at least one light emitting element disposed between the first insulating pattern and the second insulating pattern and including ends electrically connected to the first electrode and the second electrode, respectively.

A distance between the first insulating pattern and the second insulating pattern may be greater than a distance between the first electrode and the second electrode.

At least a portion of a top side of each of the first insulating pattern and the second insulating pattern may protrude upwards, and the at least one concave-convex patterns may be spaced apart from each other.

A concave or convex portion of the at least one concave-convex pattern may have at least one inclined outer side with respect to the top side of each of the first insulating pattern and the second insulating pattern.

At least a portion of the at least one concave-convex pattern may be located below a plane parallel to the first electrode and intersecting the ends of the at least one light emitting element.

The at least one concave-convex pattern may have a curved outer side.

The first insulating pattern may include a first hole pattern spaced apart from the first side and formed such that at least a portion of the top side of the first insulating pattern is recessed, and the second insulating pattern may include a second hole pattern spaced apart from the second side formed such that at least a portion of the top side of the second insulating pattern is recessed.

The at least one concave-convex pattern may be disposed between the first hole pattern and the first side, and disposed between the second hole pattern and the second side.

The display device may further comprise a fourth insulating pattern disposed between the first insulating pattern and the first electrode, a fifth insulating pattern placed between the second insulating pattern and the second electrode, and a sixth insulating pattern disposed between the fourth insulating pattern and the fifth insulating pattern, and partially overlapping each of the first end of the first electrode and the end of the second electrode.

The at least one light emitting element may be disposed on the sixth insulating pattern.

The display device may further comprise a first contact electrode disposed between the second insulating pattern and the sixth insulating pattern, and electrically contacting an end of the at least one light emitting element, and a second contact electrode disposed between the fifth insulating pattern and the sixth insulating pattern, and electrically contacting another end of the at least one light emitting element.

The display device may further comprise a third insulating pattern disposed between the first insulating pattern and the second insulating pattern, and disposed on at least a portion of a top side of the at least one light emitting element.

The display device may further comprise a bank spaced apart from a second end of the first electrode opposite to the first end of the first electrode. The first insulating pattern may be spaced apart from the bank, and the fourth insulating pattern may contact the bank.

A third side of the first insulating pattern opposite to the first side of the first insulating pattern may be located between the bank and the second end of the first electrode.

A distance between the first insulating pattern and the bank may be smaller than a distance between the first insulating pattern and the second insulating pattern.

The bank may be integral with the fourth insulating pattern.

According to an embodiment of the disclosure, a display device may comprise a first electrode extending in a first direction, and a second electrode extending in the first direction and spaced apart from the first electrode, at least one light emitting element disposed between the first electrode and the second electrode, a first insulating pattern extending in the first direction and partially overlapping the first electrode, a second insulating pattern extending in the first direction and spaced apart from the first insulating pattern and overlapping the second electrode, and at least one concave-convex pattern disposed on each of the first insulating pattern and the second insulating pattern.

A distance between the first insulating pattern and the second insulating pattern may be greater than a distance between the first electrode and the second electrode.

A first side portion of the first insulating pattern may be horizontally spaced inward from an end of the first electrode, and a second side portion of the first insulating pattern opposite to the first side portion horizontally may protrude outward beyond another end of the first electrode.

Two side portions of the second insulating pattern may be horizontally spaced inward from two ends of the second electrode, respectively.

The at least one concave-convex pattern may extend in a second direction and spaced apart from each other in a third direction different from the second direction.

The first insulating pattern may include a first hole pattern in which at least a portion of a top side of the first insulating pattern is recessed toward the first electrode. The second insulating pattern may include a second hole pattern in which at least a portion of a top side of the second insulating pattern may be recessed toward the second electrode, and each of the first hole pattern and the second hole pattern may extend in the first direction.

The at least one concave-convex pattern disposed on the first insulating pattern may be disposed between the first side portion and the first hole pattern, and the at least one concave-convex pattern disposed on the second insulating pattern may be disposed between each of side portions of the second insulating pattern and the second hole pattern.

According to an embodiment of the disclosure, a method for manufacturing a display device may comprise forming a first electrode and a second electrode on a substrate. The second electrode may be spaced apart from the first electrode, disposing at least one light emitting element between the first electrode and the second electrode, and forming at least one insulating pattern spaced apart from the at least one light emitting element and partially overlapping each of the first electrode and the second electrode. The at least one insulating pattern may have a concave-convex pattern in which at least a portion of a top side of the insulating pattern protrudes upwards.

The at least one insulating pattern may include a first insulating pattern at least partially overlapping the first electrode and, a second insulating pattern spaced apart from the first insulating pattern and at least partially overlapping the second electrode. Each of the first insulating pattern and the second insulating pattern may be spaced apart from the at least one light emitting element.

At least a portion of a top side of each of the first insulating pattern and the second insulating pattern protrudes upwards, and the concave-convex patterns may be spaced apart from each other.

The forming of the at least one insulating pattern may include forming an insulating material layer entirely overlapping the first electrode, the second electrode, and the at least one light emitting element, and exposing ends of the at least one light emitting element, and forming the first insulating pattern and the second insulating pattern having the concave-convex pattern formed thereon.

The forming of the at least one insulating pattern may be performed using a nano-imprinting process.

The method may further comprise forming a first contact electrode electrically contacting the first electrode and an end of the at least one light emitting element, and a second contact electrode electrically contacting the second electrode and another end of the at least one light emitting element.

The details of other embodiments are included in the detailed description and the accompanying drawings.

The display device according to one embodiment includes the insulating pattern onto which the light emitted from the light emitting element is incident and which includes the concave-convex pattern that receives the light and outputs upwards. As a result, in the display device free of a separate reflective electrode or reflective bank, the concave-convex pattern may output the light emitted from a side of the light emitting element in the upward direction. Thus, top emission efficiency thereof may be improved.

Further, the method for manufacturing the display device according to one embodiment may be free of a step of forming a reflective electrode or a reflective bank, and may perform the steps of forming the concave-convex pattern and forming the insulating pattern at the same time. Thus, the manufacturing process of the display device may be simplified.

The effects according to the embodiments are not limited by the contents exemplified above, and more various effects are included in this disclosure.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 6 is a schematic plan view illustrating a top side of an insulating pattern according to an embodiment.

FIG. 9 to FIG. 16 are schematic cross-sectional views illustrating a manufacturing process of a display device according to an embodiment.

FIG. 20 and FIG. 21 are schematic plan views illustrating a concave-convex pattern according to another embodiment.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
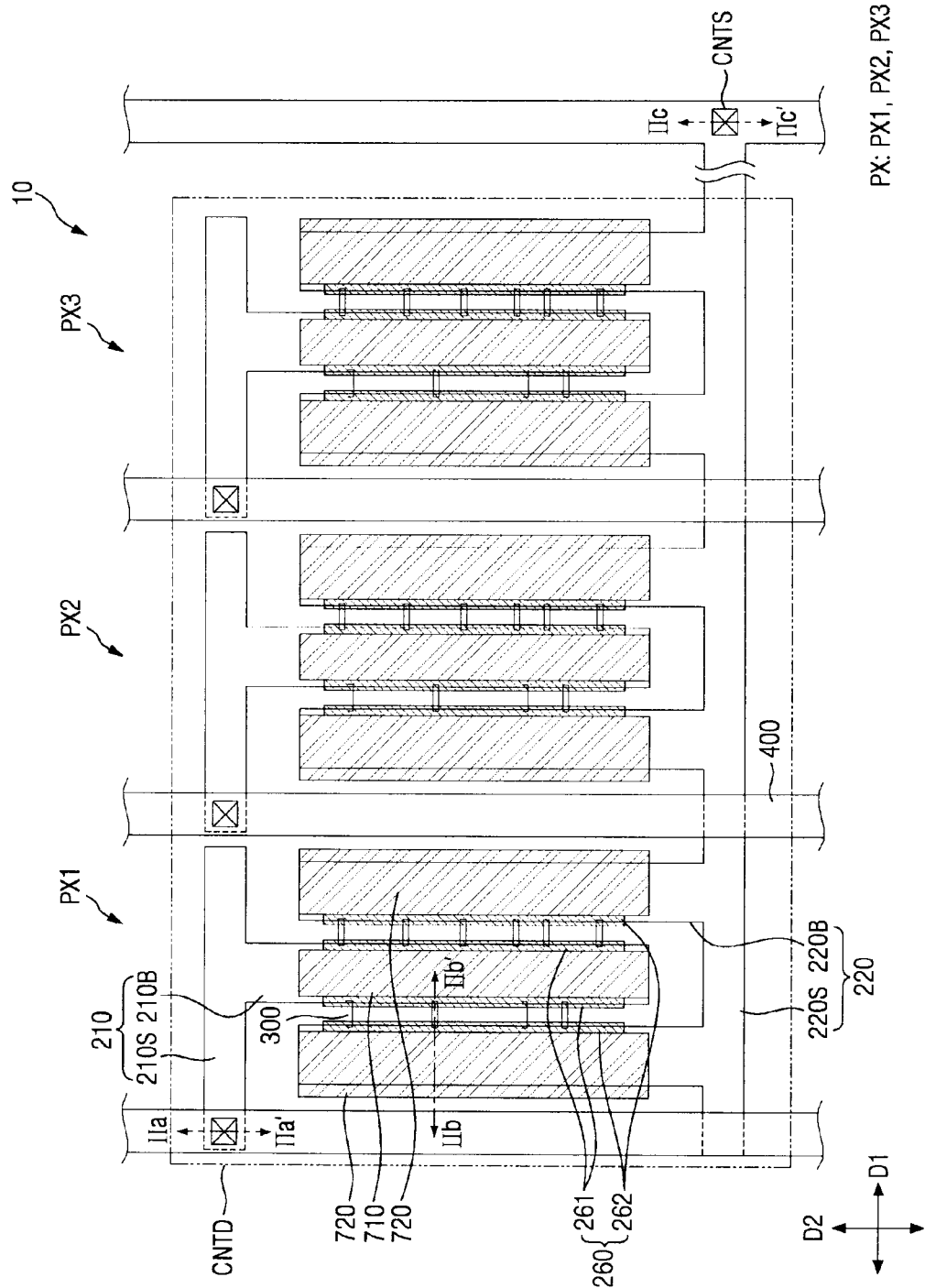
FIG. 1 is a schematic plan view of a display device according to an embodiment.

FIG. 1 is a schematic plan view of a display device according to an embodiment.

Referring to FIG. 1, a display device 10 may include pixels PX. Each of the pixels PX may include at least one light emitting element 300 that emits light of a specific wavelength band to display a specific color.

Each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be red, the second color may be green, and the third color may be blue. However, the disclosure is not limited thereto. The sub-pixels PXn may emit light of the same color (where n is a natural number). Further, FIG. 1 illustrates that a single pixel PX includes three sub-pixels PXn. However, the disclosure is not limited thereto. Each pixel PX may include a larger number of sub-pixels PXn.

As used herein, each of the terms "first," "second," etc. refers to each of components, and is used to simply distinguish components therebetween, and does not necessarily mean a corresponding component. That is, a component modified with each of the terms "first," "second," and the like is not necessarily limited to a specific structure or location. In some embodiments, another reference numeral may be assigned thereto. Accordingly, a reference numeral assigned to each component may be described based on the drawings and following descriptions. Further, a first element, component, region, layer, or section described below could be termed a second element, component, region, layer, or section, without departing from the spirit and scope of the disclosure.

Each sub-pixel PXn of the display device 10 may include a light-emitting area and a non-light-emitting area. The light-emitting area is defined as an area where a light emitting element 300 included in the display device 10 is disposed, and thus light of a specific wavelength band is output. The non-light emitting area may refer to an area other than the light-emitting area and may be defined as an area in which the light emitting element 300 is not disposed and thus light is not output.

The sub-pixel PXn of the display device 10 may include banks 400, electrodes 210 and 220, a light emitting element 300, and at least one insulating layer 600 and 700.

The electrodes 210 and 220 may be electrically connected to the light emitting element 300. A predefined voltage may be applied to the electrodes 210 and 220 so that the light emitting element 300 emits light. Further, at least a portion of each of the electrodes 210 and 220 may be utilized to generate an electric field within the sub-pixel PXn to align the light emitting element 300.

The electrodes 210 and 220 may include a first electrode 210 and a second electrode 220. In an embodiment, the first electrode 210 may act as a separate pixel electrode for each sub-pixel PXn, and the second electrode 220 may act as a common electrode for the sub-pixels PXn. One of the first electrode 210 and the second electrode 220 may act as an anode of the light emitting element 300, and the other thereof may act as a cathode of the light emitting element 300. However, the disclosure is not limited thereto. One of the first electrode 210 and the second electrode 220 may act as a cathode of the light emitting element 300, and the other thereof may act as an anode of the light emitting element 300.

The first electrode 210 and the second electrode 220 may include electrode stems 210S and 220S extending in a first direction D1, respectively, and at least one electrode branch 210B and at least one electrode branch 220B respectively branching from the electrode stems 210S and 220S and extending in a second direction D2 intersecting the first direction D1, respectively.

The first electrode 210 may include a first electrode stem 210S extending in the first direction D1, and at least one first electrode branch 210B branching from the first electrode stem 210S and extending in the second direction D2.

The first electrode stem 210S of a pixel may be discontinuous at a boundary between adjacent sub-pixels PXn. The first electrode stem 210S may continuously extend in substantially the same straight line across neighboring sub-pixels (adjacent to each other in the first direction D1) in the same row except for the discontinuity at the boundary between the adjacent sub-pixels PXn. Accordingly, different first electrode stems 210S disposed in different sub-pixels PXn may apply different electrical signals to different first electrode branches 210B, such that the different first electrode branches 210B may be driven separately.

The first electrode branch 210B may branch from at least a portion of the first electrode stem 210S, may extend in the second direction D2, and may be terminated so as to be spaced apart from the second electrode stem 220S opposite to the first electrode stem 210S.

The second electrode 220 may include a second electrode stem 220S extending in the first direction D1 and spaced apart from and opposite to the first electrode stem 210S, and a second electrode branch 220B branching from the second electrode stem 220S and extending in the second direction D2. The second electrode stem 220S may extend across sub-pixels PXn adjacent to the pixel PX in the first direction D1 without a discontinuity at a boundary between adjacent sub-pixels. Accordingly, the second electrode stem 220S may continuously extend across adjacent pixels PX arranged in the first direction D1 without a discontinuity at a boundary between adjacent pixels.

The second electrode branch 220B may be spaced apart from and extend in a parallel manner to the first electrode branch 210B and may be terminated so as to be spaced apart from the first electrode stem 210S. For example, the second electrode branch 220B may be disposed in the sub-pixel PXn and have an end connected to (and integral with) the second electrode stem 220S, and the opposite end spaced apart from the first electrode stem 210S.

Although FIG. 1 shows that two second electrode branches 220B are disposed in each sub-pixel PXn and a single first electrode branch 210B is disposed between the two second electrode branches 220B, the disclosure is not limited thereto.

The bank 400 may be disposed at a boundary between the sub-pixels PXn. As a result, the first electrode stem 210S may be discontinuous at the bank 400, and the second electrode stem 220S may extend while passing by and under the bank 400. The bank 400 may extend in the second direction D2 and be disposed at the boundary between the sub-pixels PXn arranged in the first direction D1. However, the disclosure is not limited thereto. The bank 400 may extend in the first direction D1 and may be disposed at the boundary between the sub-pixels PXn arranged in the second direction D2.

The light emitting elements 300 may be disposed between the first electrode branch 210B and the second electrode branch 220B. Each of at least some of the light emitting elements 300 may have an end electrically connected to the first electrode branch 210B and another end electrically connected to the second electrode branch 220B.

The light emitting elements 300 may be arranged and spaced from each other in the second direction D2 and may be aligned with each other and may be substantially parallel to each other. A distance between the light emitting elements 300 is not particularly limited. In an embodiment, light emitting elements 300 may be spaced from each other by a constant distance. In an embodiment, light emitting elements 300 may be spaced from each other by irregular distances. In an embodiment, some of light emitting elements 300 may be spaced from each other by a constant distance, while the other of the plurality of light emitting elements 300 may be spaced from each other by irregular distances.

Insulating layers 600 and 700 are disposed in each sub-pixel PXn. The insulating layers 600 and 700 may include a first insulating layer 600 and a second insulating layer 700. Although not shown in the drawing, the first insulating layer 600 may be disposed to cover (or overlap) an entire area of the sub-pixel PXn including the first electrode branch 210B and the second electrode branch 220B. The first insulating layer 600 may protect the electrodes 210 and 220 and insulate the electrodes 210 and 220 from each other so that the electrodes 210 and 220 do not directly contact each other.

The second insulating layer 700 may be disposed on the first insulating layer 600, and at least a portion of the second insulating layer 700 may be disposed to partially overlap each of the electrode branches 210B and 220B. The second insulating layer 700 may include insulating patterns 710, 720, and 730, for example, first, second, and third insulating patterns 710, 720, 730. A first insulating pattern 710 and a second insulating pattern 720 may be disposed to overlap the first electrode branch 210B and the second electrode branch 220B, respectively. The insulating patterns 710, 720, and 730 may extend in a direction and may be spaced apart from each other in a direction different from the direction.

The first insulating pattern 710 may extend in the second direction D2 and may be disposed on the first electrode branch 210B. For example, a width of the first insulating pattern 710 may be smaller than a width of the first electrode branch 210B. The first insulating pattern 710 may extend in a direction in which the first electrode branch 210B extends and may be disposed between two contact electrodes 260 which will be described below. The first insulating pattern 710 may have both side portions contacting the two contact electrodes 260, respectively. However, the disclosure is not limited thereto. The first insulating pattern 710 may have both opposing side portions spaced from or overlapping the two contact electrodes 260, respectively.

The second insulating pattern 720 may extend in the second direction D2 and may be disposed to partially overlap the second electrode branch 220B. Unlike the first insulating pattern 710, a portion of the second insulating pattern 720 may be disposed on the second electrode branch 220B, and another portion thereof may be disposed on the first insulating layer 600. A side of the second insulating pattern 720 may be disposed to contact, to be spaced from, or to overlap the contact electrode 260, while another side thereof may be disposed between a side portion of the second electrode branch 220B and the bank 400. However, the disclosure is not limited thereto.

Although not shown in the drawing, a third insulating pattern 730 may be disposed between the first insulating pattern 710 and the second insulating pattern 720. The third insulating pattern 730 may be disposed on the light emitting elements 300 and extend in a direction in which the light emitting elements 300 are arranged, for example, in the second direction D2. The third insulating pattern 730 may be disposed on the light emitting elements 300 and extend in the second direction D2. Thus, the third insulating pattern 730 may be disposed on the first insulating layer 600 in an area where the light emitting element 300 is not disposed. For example, the third insulating pattern 730 may be formed to substantially surround an outer side of the light emitting element 300.

A shape of each of the insulating patterns 710, 720, and 730 may be formed by placing a material forming (or constituting) the second insulating layer 700 to cover (or overlap) an entire area of each pixel PX or the sub-pixel PXn and partially patterning the placed material. However, the disclosure is not limited thereto. The insulating patterns 710, 720, and 730 of the second insulating layer 700 may be formed by a single process.

In an embodiment, in the display device 10 according to one embodiment, at least one of the first insulating layer 600 and the second insulating layer 700 may include a concave-convex pattern 650_3 or 750, and thus may provide a light output path along which light emitted from the light emitting element 300 is output. The concave-convex pattern 650_3 or 750 may be formed in a partial insulating pattern of the first or second insulating layer 600 or 700. At least a portion of the light emitted from the light emitting element 300 may be incident on the first insulating layer 600 or the second insulating layer 700, and exit therefrom toward a top of each sub-pixel PXn through the concave-convex pattern 650_3 or 750. Detailed descriptions of the insulating layers 600 and 700 and the insulating patterns 710, 720, and 730 will be described below with reference to other drawings.

Each contact electrode 260 may be disposed on each of the first electrode branch 210B and the second electrode branch 220B. In this connection, a substantial portion of each contact electrode 260 may be disposed on the first insulating layer 600, and at least a portion of each contact electrode 260 may contact each of the first electrode branch 210B and the second electrode branch 220B or may be electrically connected thereto.

Contact electrodes 260 may extend in the second direction D2, and may be arranged and be spaced apart from each other in the first direction D1. Each contact electrode 260 may contact at least one end of the light emitting element 300, and each contact electrode 260 may be electrically connected to the first electrode 210 or the second electrode 220 and thus receive an electrical signal therefrom. Accordingly, each contact electrode 260 may transmit the electrical signal transmitted from the first electrode 210 or the second electrode 220 to the light emitting element 300.

The contact electrodes 260 may include a first contact electrode 261 and a second contact electrode 262. The first contact electrode 261 may be disposed on the first electrode branch 210B and may contact an end of the light emitting element 300. The second contact electrode 262 may be disposed on the second electrode branch 220B and may contact another end of the light emitting element 300.

The first electrode stem 210S and the second electrode stem 220S may be electrically connected to a circuit element layer of the display device 10 via contact holes, for example, a first electrode contact hole CNTD and a second electrode contact hole CNTS, respectively. The drawing shows that a second electrode contact hole CNTS is formed in the second electrode stem 220S of the sub-pixels PXn. However, the disclosure is not limited thereto. In some embodiments, the second electrode contact hole CNTS may be formed in each sub-pixel PXn.

The display device 10 may further include the circuit element layer positioned below the electrodes 210 and 220 shown in FIG. 1. Hereinafter, a structure of the display device 10 will be described in detail with reference to FIG. 2.

Figure 2:
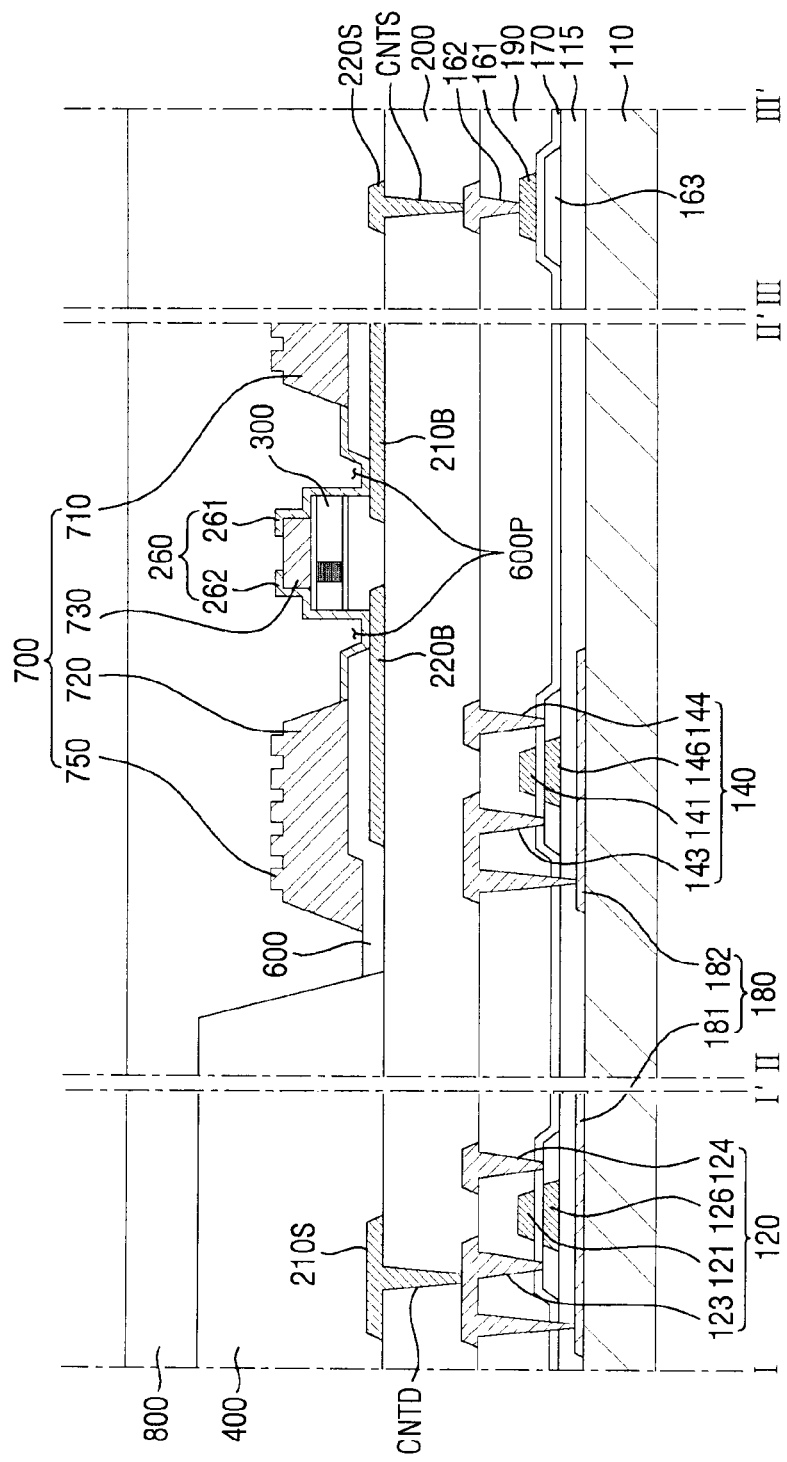
FIG. 2 is a schematic cross-sectional view taken along lines IIa-IIa', and IIc-IIc' in FIG. 1.

FIG. 2 is a schematic cross-sectional view taken along lines IIa-IIa', IIb-IIb', and IIc-IIc' in FIG. 1.

FIG. 2 illustrates a schematic cross-sectional view of the first sub-pixel PX1. However, this cross-sectional view may be equally applied to another pixel PX or sub-pixel PXn. FIG. 2 illustrates a cross-section between an end and another end of a light emitting element 300.

Referring to FIGS. 1 and 2, the display device 10 may include a substrate 110, a buffer layer 115, a light-blocking layer 180, first and second transistors 120 and 140, and the electrodes 210 and 220, the light emitting element 300, the first insulating layer 600, and the second insulating layer 700 disposed above the first and second transistors 120 and 140.

The substrate 110 may be embodied as an insulating substrate. The substrate 110 may be made of an insulating material such as glass, quartz, or polymer resin. Further, the substrate 110 may be a rigid substrate, or may be a flexible substrate which is capable of being bent, being folded, or is rollable.

The light-blocking layer 180 may be disposed on the substrate 110. The light-blocking layer 180 may include a first light-blocking layer 181 and a second light-blocking layer 182. The first light-blocking layer 181 may be electrically connected to a first drain electrode 123 of the first transistor 120 to be described below. The second light-blocking layer 182 may be electrically connected to a second drain electrode 143 of the second transistor 140 to be described below.

The first light-blocking layer 181 and the second light-blocking layer 182 may be disposed to overlap a first active material layer 126 of the first transistor 120 and a second active material layer 146 of the second transistor 140, respectively. Each of the first and second light-blocking layers 181 and 182 may include a material that blocks light, and thus may prevent light from being incident on each of the first and second active material layers 126 and 146. In an embodiment, each of the first and second light-blocking layers 181 and 182 may be made of an opaque metal material that blocks light transmission.

The buffer layer 115 may be disposed on the light-blocking layer 180 and the substrate 110. The buffer layer 115 may be disposed to cover (or overlap) an entire area of the substrate 110, including the light-blocking layer 180. The buffer layer 115 may prevent diffusion of impurity ions, prevent invasion of moisture or external air, and perform a surface planarization function. Further, the buffer layer 115 may insulate the light-blocking layer 180 and the first and second active material layers 126 and 146 from each other.

A semiconductor layer may be disposed on the buffer layer 115. The semiconductor layer may include the first active material layer 126 of the first transistor 120, the second active material layer 146 of the second transistor 140, and an auxiliary material layer 163. The semiconductor layer may include polycrystalline silicon, monocrystalline silicon, oxide semiconductor, and the like.

A first gate insulating film 170 may be disposed on the semiconductor layer. The first gate insulating film 170 may be disposed to cover (or overlap) an entire area of the buffer layer 115, including the semiconductor layer. The first gate insulating film 170 may function as a gate insulating film of each of the first and second transistors 120 and 140.

A first conductive layer may be disposed on the first gate insulating film 170. The first conductive layer may include a first gate electrode 121 disposed on the first gate insulating film 170 on the first active material layer 126 of the first transistor 120, a second gate electrode 141 disposed on the first gate insulating film 170 on the second active material layer 146 of the second transistor 140, and a power line 161 disposed on the first gate insulating film 170 on the auxiliary material layer 163.

An interlayer insulating film 190 may be disposed on the first conductive layer. The interlayer insulating film 190 may perform an interlayer insulating function. Further, the interlayer insulating film 190 may include an organic insulating material and may perform a surface planarization function.

A second conductive layer may be disposed on the interlayer insulating film 190. The second conductive layer may include the first drain electrode 123 and a first source electrode 124 of the first transistor 120, the second drain electrode 143 and a second source electrode 144 of the second transistor 140, and a power electrode 162 disposed on the power line 161.

Each of the first drain electrode 123 and the first source electrode 124 may be electrically connected to the first active material layer 126 via a first contact hole extending through the interlayer insulating film 190 and the first gate insulating film 170. Each of the second drain electrode 143 and the second source electrode 144 may be electrically connected to the second active material layer 146 via a second contact hole extending through the interlayer insulating film 190 and the first gate insulating film 170. Further, the first drain electrode 123 and the second drain electrode 143 may be electrically connected to the first light-blocking layer 181 and the second light-blocking layer 182 via further contact holes, respectively.

A via layer 200 may be disposed on the second conductive layer. The via layer 200 may include an organic insulating material and perform a surface planarization function.

The bank 400 and the electrodes 210 and 220 are disposed on the via layer 200. The bank 400 may be disposed at a boundary between the sub-pixels PXn such that the sub-pixels PXn are spaced apart from each other.

The bank 400 may define the boundary between the sub-pixels PXn. The bank 400 may extend in the first direction D1 and the second direction D2 to form a grid pattern and may be disposed at the boundary between the sub-pixels PXn. In case that an organic material or a solvent is sprayed using an inkjet printing method in manufacturing the display device 10, the bank 400 may perform a function of preventing the organic material or the solvent from flowing between the sub-pixels PXn. As another example, in case that the display device 10 further includes another member, the another member may be disposed on the bank 400 so that the bank 400 may support the another member. The bank 400 may include polyimide (PI).

However, the disclosure is not limited thereto. The bank 400 may not necessarily be disposed on the via layer 200. The bank 400 and the insulating layers 600 and 700 may be formed by a single process. In this case, the bank 400 may be integral with the insulating layers 600 and 700 and may have a partially protruding shape.

The electrodes 210 and 220 may be disposed on the via layer 200. As described above, each of the electrodes 210 and 220 includes each of the electrode stems 210S and 220S and each of the electrode branches 210B and 220B. Line IIa-IIa' in FIG. 1 extends across the first electrode stem 210S, line IIb-IIb' in FIG. 1 extends across the first electrode branch 210B and the second electrode branch 220B, and line IIc-IIc' in FIG. 1 extends across the second electrode stem 220S. Each of the electrode stems 210S and 220S and each of the electrode branches 210B and 220B may form each of the first electrode 210 and the second electrode 220.

At least a portion of the first electrode stem 210S may overlap the bank 400. As described above, the first electrode stem 210S extends in the first direction D1 and is discontinuous at the bank 400. An end of the first electrode stem 210S of the sub-pixel PXn may overlap the bank 400, and the opposite end thereof may be spaced apart from the other bank 400. An end of the first electrode stem 210S overlapping the bank 400 may be electrically connected to the first drain electrode 123 via the first electrode contact hole CNTD that extends through the via layer 200 and exposes a portion of the first drain electrode 123 of the first transistor (or driving transistor) 120. The first electrode stem 210S may be electrically connected to the first drain electrode 123 of the driving transistor 120 and may receive a predefined electrical signal therefrom.

The first electrode branch 210B and the second electrode branch 220B may be spaced apart from each other. The first electrode branch 210B and the second electrode branch 220B are disposed in a central region of each sub-pixel PXn and are spaced apart from each other in the first direction D1. The light emitting elements 300 may be disposed in a space between the first electrode branch 210B and the second electrode branch 220B.

The second electrode stem 220S may extend in a direction and further extend into the non-light emitting area where the light emitting elements 300 are not disposed. The second electrode stem 220S may contact the power electrode 162 via a second electrode contact hole CNTS that extends through the via layer 200 and exposes a portion of the power electrode 162. The second electrode stem 220S may be electrically connected to the power electrode 162 and may receive a predefined electrical signal from the power electrode 162.

Each of the electrodes 210 and 220 may include a transparent conductive material. In an embodiment, each of the electrodes 210 and 220 may include a material such as ITO (Indium Tin Oxide), IZO (Indium Zinc Oxide), ITZO (Indium Tin-Zinc Oxide), etc. However, the disclosure is not limited thereto. In some embodiments, each of the electrodes 210 and 220 may include a conductive material having high reflectivity. For example, each of the electrodes 210 and 220 may include a metal such as silver (Ag), copper (Cu), aluminum (Al), etc. as the conductive material having high reflectivity. In this case, light incident on each of the electrodes 210 and 220 may be reflected therefrom and emitted toward a top of each sub-pixel PXn.

Further, each of the electrodes 210 and 220 may have a structure in which at least one transparent conductive material layer and at least one metal layer having high reflectivity are vertically stacked or may be composed of a single layer including the transparent conductive material and the metal having high reflectivity. In an embodiment, each of the electrodes 210 and 220 may have a stack structure of ITO/Ag/ITO/IZO, or may include an alloy including aluminum (Al), nickel (Ni), lanthanum (La), and the like. However, the disclosure is not limited thereto.

The first insulating layer 600 may be disposed to partially cover (or overlap) each of the first electrode 210 and the second electrode 220. The first insulating layer 600 may be disposed to cover a substantial portion of a top side of each of the first electrode 210 and the second electrode 220, but to expose a portion of each of the first electrode 210 and the second electrode 220. The first insulating layer 600 may include a patterned portion 600P exposing a portion of each of ends of the electrode branches 210B and 220B facing each other. Accordingly, the first insulating layer 600 may be discontinuous at the patterned portion 600P. The contact electrode 260 may be disposed on the patterned portion 600P such that the contact electrode 260 may contact the electrodes 210 and 220. Further, the first insulating layer 600 may be partially disposed in an area between the second electrode branch 220B and the bank 400. A portion of the first insulating layer 600 disposed in an area between the first electrode branch 210B and the second electrode branch 220B may extend in the second direction D2 and thus have an island shape or a linear shape.

The first insulating layer 600 may protect the first electrode 210 and the second electrode 220 and insulate the first electrode 210 and the second electrode 220 from each other. Further, the first insulating layer 600 may prevent the light emitting element 300 disposed on the first insulating layer 600 from directly contacting and damaged by other members. However, the shape and structure of the first insulating layer 600 are not limited thereto. In some embodiments, the first insulating layer 600 may have an insulating pattern having a concave-convex pattern formed thereon. For example, in case that the second insulating layer 700 is omitted, the first insulating layer 600 may include insulating patterns 610_3, 620_3, and 630_3 (shown in FIG. 24), and a concave-convex pattern 650_3 (shown in FIG. 24) may be formed on the insulating pattern 610_3, 620_3, or 630_3. In this case, the light emitted from the light emitting element 300 may be incident on the first insulating layer 600 and may be emitted toward the top of the sub-pixel PXn through the concave-convex pattern 650_3 of the first insulating layer 600. A detailed description thereof will be described below with reference to other drawings.

The light emitting element 300 may be disposed on the first insulating layer 600. At least one light emitting element 300 may be disposed on a portion of the first insulating layer 600 disposed between the electrode branches 210B and 220B. Both opposing ends of the light emitting element 300 may be respectively aligned with both opposing ends of the underlying first insulating layer 600. The light emitting element 300 may partially overlap the electrodes 210 and 220. The light emitting element 300 may overlap each of ends of the first electrode branch 210B and the second electrode branch 220B facing toward each other and may be electrically connected to each of the electrodes 210 and 220 via the contact electrode 260.

In an embodiment, the light emitting element 300 may include layers arranged in a direction parallel to the via layer 200. The light emitting element 300 of the display device 10 according to an embodiment may include semiconductor layers of conductive types as above-described, and the active layer which may be sequentially arranged in a direction parallel to the via layer 200. As shown in the drawing, the light emitting element 300 may include a first conductive type semiconductor 310, an active layer 330, a second conductive type semiconductor 320, and a conductive electrode layer 370 which may be sequentially arranged in a direction parallel to the via layer 200. However, the disclosure is not limited thereto. An order in which the layers of the light emitting element 300 are arranged may be reversed. In some embodiments, in case that the light emitting element 300 has a different structure from the above structure, the layers may be arranged in a direction perpendicular to the via layer 200.

The second insulating layer 700 may be partially disposed on the first insulating layer 600 and the light emitting element 300. The second insulating layer 700 may include the first insulating pattern 710, the second insulating pattern 720, and the third insulating pattern 730 as the insulating patterns. The first insulating pattern 710 and the second insulating pattern 730 may be disposed to overlap the first electrode branch 210B and the second electrode branch 220B, respectively, and the third insulating pattern 730 may be disposed on the light emitting element 300.

The third insulating pattern 730 may protect the light emitting element 300 and perform a function of fixing the light emitting element 300 in the process of manufacturing the display device 10. The third insulating pattern 730 may be disposed to partially surround an outer side of the light emitting element 300. For example, a portion of a material of the third insulating pattern 730 may be disposed between a bottom side of the light emitting element 300 and the first insulating layer 600. The third insulating pattern 730 may extend in the second direction D2 and between the first electrode branch 210B and the second electrode branch 220B and thus may have an island-like or linear shape in a plan view.

The first insulating pattern 710 and the second insulating pattern 720 are disposed on the first insulating layer 600. The first insulating pattern 710 and the second insulating pattern 720 may be spaced apart from the patterned portion 600P of the first insulating layer 600. For example, each of sides of the first insulating pattern 710 and the second insulating pattern 720 facing each other may be disposed on the first insulating layer 600 and may be horizontally spaced from the patterned portion 600P. In an embodiment, the drawing shows that each of the sides of the first insulating pattern 710 and the second insulating pattern 720 facing each other is inclined at a predefined angle. However, the disclosure is not limited thereto. Each of the sides of the first insulating pattern 710 and the second insulating pattern 720 facing each other may extend in a perpendicular to a top side of the first insulating layer 600.

In an embodiment, the first insulating pattern 710 and the second insulating pattern 720 may overlap the electrodes 210 and 220 or the electrode branches 210B and 220B, respectively. At least one side of each of the first insulating pattern 710 and the second insulating pattern 720 may vertically overlap each of the electrode branches 210B and 220B and may be horizontally spaced apart from a corresponding side of each of the electrode branches 210B and 220B.

The first insulating pattern 710 may overlap the first electrode branch 210B. Both opposing sides of the first insulating pattern 710 may overlap the first electrode branch 210B and may be horizontally spaced apart from both opposing sides of the first electrode branch 210B, respectively. Although not shown in the drawing, the opposite side of the first insulating pattern 710 may overlap the first electrode branch 210B and may be horizontally spaced from the opposite side of the first electrode branch 210B. Accordingly, both opposing sides of the first insulating pattern 710 may be spaced apart from the light emitting elements 300. As another example, both opposing sides of the first insulating pattern 710 may be aligned with both opposing sides of the first electrode branch 210B, respectively.

The second insulating pattern 720 may overlap the second electrode branch 210B. One side thereof may overlap the second electrode branch 210B and be horizontally spaced apart from one side of the second electrode branch 220B. Thus, one side of the second insulating pattern 720 may be spaced apart from the light emitting element 300. However, the opposite side of the second insulating pattern 720 may be positioned between the opposite side of the second electrode branch 220B and the bank 400. For example, only a portion of the second insulating pattern 720 may overlap the second electrode branch 220B, while an entirety of the first insulating pattern 710 may overlap the first electrode branch 210B.

According to an embodiment, the second insulating layer 700 may include concave-convex patterns 750 respectively disposed on the first insulating pattern 710 and the second insulating pattern 720. The concave-convex pattern 750 may have a shape in which a top side of each of the first insulating pattern 710 and the second insulating pattern 720 partially protrudes upwards. The concave-convex patterns 750 may be spaced apart from each other. The light emitted from the light emitting element 300 may travel without directionality. At least some of light beams may travel in a direction in which the light emitting element 300 extends, for example, in a direction parallel to the top side of the via layer 200. As described above, the first insulating pattern 710 and the second insulating pattern 720 may be spaced apart from and face the light emitting element 300. Thus, a portion of the light emitted from the light emitting element 300 may be incident on the first insulating pattern 710 and the second insulating pattern 720, for example, the second insulating layer 700.

In an embodiment, the second insulating layer 700 and the first insulating layer 600 may include materials having different refractive indexes. The light incident on the second insulating layer 700 may be reflected from an interface between a flat bottom side of the second insulating layer 700 and a flat top side of the first insulating layer 600, and then may be emitted toward the concave-convex pattern 750 and then be output from the concave-convex pattern 750. The concave-convex pattern 750 may be formed by patterning a top side of the second insulating layer 700 or performing a nano-imprinting method on the top side of the second insulating layer 700 during a process of forming the second insulating layer 700. In an embodiment, a vertical dimension measured from the via layer 200 to a top side of the third insulating pattern 730 may be approximate to an average value of a vertical dimension measured from the via layer 200 to a top side of the first insulating pattern 710 or the second insulating pattern 720 and a vertical dimension measured from the via layer 200 to a top side of the concave-convex pattern 750. For example, the vertical dimension measured from the via layer 200 to the top side of the third insulating pattern 730 may be larger than the vertical dimension measured from the via layer 200 to the top side of the first insulating pattern 710 or the second insulating pattern 720, but may be smaller than the vertical dimension measured from the via layer 200 to the top side of the concave-convex pattern 750. However, the disclosure is not limited thereto.

The drawing shows that the concave-convex pattern 750 has five convex portions on each of the first and second insulating patterns 710 and 720. However, the disclosure is not limited thereto. The concave-convex pattern 750 may be formed on an entire area of the top side of each of the first and second insulating patterns 710 and 720. In some embodiments, the concave-convex pattern 750 may be formed on a portion of the top side of each of the first and second insulating patterns 710 and 720 spaced apart from both opposing sides of each of the first and second insulating patterns 710 and 720. Further, a shape of a convex portion or a concave portion of the concave-convex pattern 750 is not limited to a rectangular shape. The shape of the convex portion or the concave portion of the concave-convex pattern 750 may have various shapes. A detailed description thereof will be described below with reference to other drawings.

The contact electrode 260 may be disposed on each of the electrodes 210 and 220, the first insulating layer 600, and the second insulating layer 700. The first contact electrode 261 and the second contact electrode 262 may be disposed on the third insulating pattern 730 of the second insulating layer 700 and be spaced apart from each other. Accordingly, the second insulating layer 700 may insulate the first contact electrode 261 and the second contact electrode 262 from each other.

In an embodiment, the first contact electrode 261 may contact a portion of the first electrode 210 exposed through the patterned portion 600P of the first insulating layer 600, and an end of the light emitting element 300. The second contact electrode 262 may contact a portion of the second electrode 220 exposed through patterned portion 600P, and the opposite end of the light emitting element 300. The first and second contact electrodes 261 and 262 may respectively contact both opposing sides of the light emitting element 300, for example, the first conductive type semiconductor 310, the second conductive type semiconductor 320, or the conductive electrode layer 370. Both opposing sides of the first insulating layer 600 disposed between the first electrode branch 210B and the second electrode branch 220B and corresponding to the patterned portion 600P may be respectively aligned with both opposing sides of the light emitting element 300. Thus, the contact electrode 260 may smoothly contact both opposing sides of the light emitting element 300.

Further, the first and second contact electrodes 261 and 262 may respectively contact the first and second insulating patterns 710 and 720 disposed on the first insulating layer 600. The first and second contact electrodes 261 and 262 may be respectively disposed on both portions of the first insulating layer 600 adjacent to the patterned portion 600P and facing each other and may extend toward the first insulating pattern 710 and the second insulating pattern 720. The drawing shows that lower ends of the first and second contact electrodes 261 and 262 respectively extend to and contact the first and second insulating patterns 710 and 720. However, the disclosure is not limited thereto. The first and second contact electrodes 261 and 262 may be respectively spaced apart from the first and second insulating patterns 710 and 720 or may respectively partially and vertically overlap the first and second insulating patterns 710 and 720.

The contact electrode 260 may include a conductive material. An example of the conductive material may include ITO, IZO, ITZO, aluminum (Al), etc. However, the disclosure is not limited thereto.

A passivation layer 800 may be disposed on the bank 400, the first insulating layer 600, the second insulating layer 700, and the contact electrode 260. The passivation layer 800 may function to protect the members disposed on the via layer 200 from an external environment.

Each of the first insulating layer 600, the second insulating layer 700, and the passivation layer 800 as described above may include an inorganic insulating material or an organic insulating material. In an embodiment, each of the first insulating layer 600, the second insulating layer 700, and the passivation layer 800 may include an inorganic insulating material such as silicon oxide (SiOx), silicon nitride (SiNx), silicon oxynitride (SiOxNy), aluminum oxide ($Al_2O_3$), aluminum nitride (AlN), and the like. As another example, each of the first insulating layer 600, the second insulating layer 700, and the passivation layer 800 may include an organic insulating material including acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, polymethyl methacrylate-polycarbonate synthetic resin, etc. However, the disclosure is not limited thereto.

Figure 3:
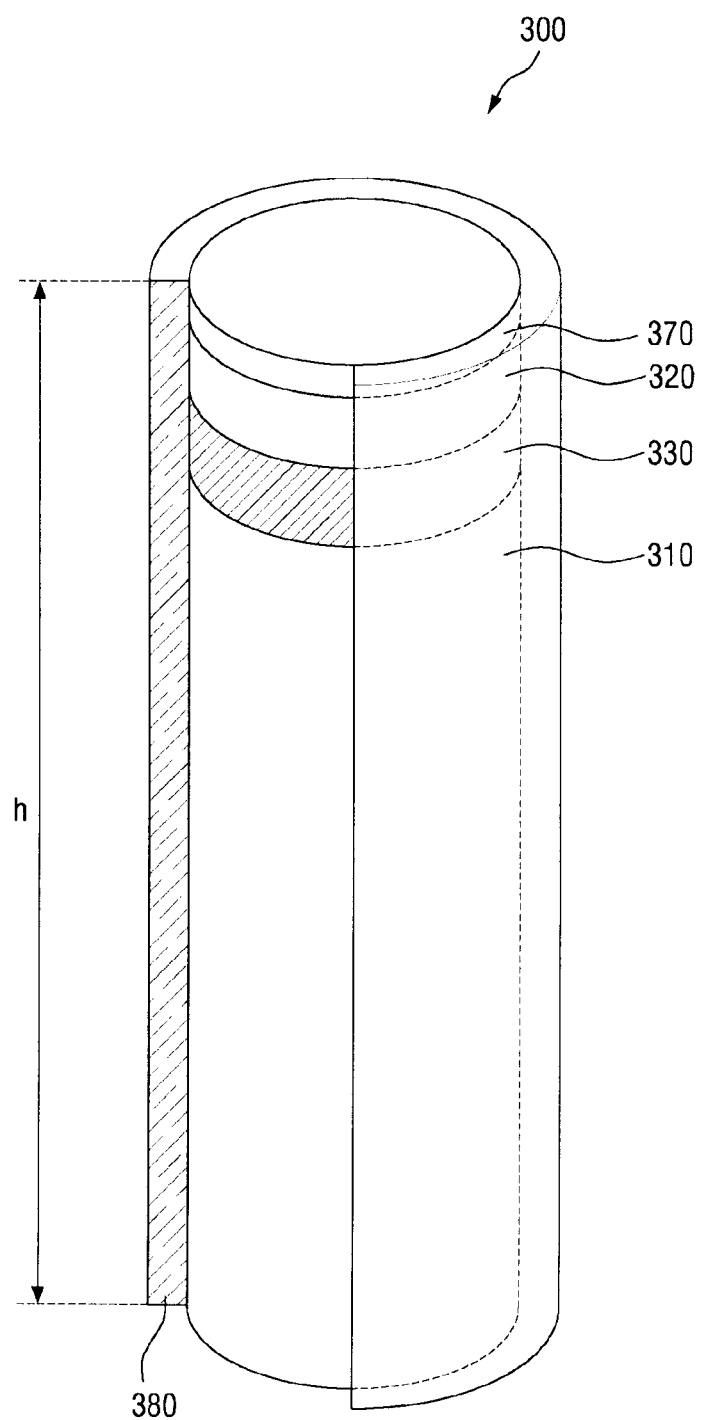
FIG. 3 is a schematic diagram of a light emitting element according to an embodiment.

FIG. 3 is a schematic diagram of a light emitting element according to an embodiment.

The light emitting element 300 may be a light emitting diode. Specifically, the light emitting element 300 may be embodied as an inorganic light-emissive diode made of an inorganic material and having a size of nano-meter to micro-meter. The light emitting elements 300 may be arranged between the two electrodes facing each other. In case that an electric field in a specific orientation is generated between the two electrodes and thus each of the two electrodes is polarized, the light emitting elements ED may be aligned in the same orientation therebetween.

The light emitting element 300 may have a shape extending in one direction (or first direction). The light emitting element 300 may have a shape such as a nanorod, a nanowire, or a nanotube. In an embodiment, the light emitting element 300 may have a cylindrical or shape. However, the shape of the light emitting element 300 is not limited thereto. The light emitting element 300 may have a variety of shapes. In another example, the light emitting element 300 may have a shape of a polygonal prism such as a cube, a cuboid, or a hexagonal prism. Semiconductors included in the light emitting element 300 to be described below may be sequentially arranged or stacked in said one direction (or first direction).

The light emitting element 300 may include a semiconductor crystal doped with impurities of any conductive type, for example, p-type or n-type impurities. The semiconductor crystal may receive an electrical signal applied from an external power source and emit light in a specific wavelength band in response to the electrical signal.

The light emitting element 300 according to an embodiment may emit light of a specific wavelength band. In an embodiment, light emitted from the active layer 330 may be blue light having a central wavelength band in a range of about 450 nm to about 495 nm. However, it should be understood that the central wavelength band of blue light is not limited to the above-described range and includes all wavelength ranges in which light may be recognized as blue light in the art. Further, the light emitted from the active layer 330 of the light emitting element 300 is not limited thereto. The light emitted from the active layer 330 of the light emitting element 300 may be green light having a central wavelength band in a range of about 495 nm to about 570 nm or be red light having a central wavelength band in a range of about 620 nm to about 750 nm.

In an embodiment, the light emitting element 300 according to an embodiment may include the first conductive type semiconductor 310, the second conductive type semiconductor 320, the active layer 330, and an insulating film 380. Further, the light emitting element 300 according to an embodiment may further include at least one conductive electrode layer 370. FIG. 3 illustrates that the light emitting element 300 further includes a conductive electrode layer 370. However, the disclosure is not limited thereto. In some embodiments, the light emitting element 300 may include a larger number of conductive electrode layers 370 or may be free of the conductive electrode layer 370. Following descriptions of the light emitting element 300 may be equally applied to a case where the number of the conductive electrode layers 370 varies or the light emitting element 300 further includes another component.

Referring to FIG. 3, the first conductive type semiconductor 310 may be, for example, an n-type semiconductor. The first conductive type semiconductor layer 310 may include a semiconductor material having a chemical formula of $Al_xGa_yIn_{1-x-y}N$ (0≤x≤1, 0≤y≤1, 0≤x+y≤1). For example, the first conductive type semiconductor 310 may be made of at least one of AlGaInN, GaN, AlGaN, InGaN, AlN, and InN and may be doped with a n-type dopant. The first conductive type semiconductor 310 may be doped with an n-type dopant, for example, Si, Ge, Sn, or the like. In an embodiment, the first conductive type semiconductor 310 may be n-GaN doped with an n-type dopant of Si. A length of the first conductive type semiconductor 310 may be in a range of about 1.5 μm to about 5 μm. However, the disclosure is not limited thereto.

The second conductive type semiconductor 320 may be disposed on the active layer 330 which will be described below. The second conductive type semiconductor 320 may be, for example, a p-type semiconductor. In an embodiment, in case that the light emitting element 300 emits light of a blue or green wavelength band, the second conductive type semiconductor 320 may include a semiconductor material having a chemical formula of $Al_xGa_yIn_{1-x-y}N$ (0≤x≤1, 0≤y≤1, 0≤x+y≤1). For example, the second conductive type semiconductor layer 320 may be made of at least one of AlGaInN, GaN, AlGaN, InGaN, AlN, and InN and may be doped with a p-type dopant. The second conductive type semiconductor layer 320 may be doped with a p-type dopant, for example, Mg, Zn, Ca, Se, Ba, or the like. In an embodiment, the second conductive type semiconductor 320 may be p-GaN doped with p-type Mg. A length of the second conductive type semiconductor 320 may be in a range of about 0.0 μm to about 0.25 μm. However, the disclosure is not limited thereto.

In an embodiment, the drawing shows that each of the first conductive type semiconductor 310 and the second conductive type semiconductor 320 is composed of a single layer. However, the disclosure is not limited thereto. In some embodiments, depending on the material of the active layer 330, each of the first conductive type semiconductor 310 and the second conductive type semiconductor 320 may include a larger number of layers, for example, a clad layer or a TSBR (tensile strain barrier reducing) layer.

The active layer 330 may be disposed between the first conductive type semiconductor 310 and the second conductive type semiconductor 320. The active layer 330 may include a material of a single or multiple quantum well structure. In case that the active layer 330 includes the material of the multiple quantum well structure, the active layer 330 may have a structure in which quantum layers and well layers are alternately stacked with each other. The active layer 330 may emit light via combinations of electrons and holes according to an electrical signal applied through the first conductive type semiconductor 310 and the second conductive type semiconductor 320. In an embodiment, in case that the active layer 330 emits light of a blue wavelength band, the active layer 330 may include a material such as AlGaN and AlGaInN. In case that the active layer 330 has a structure in which quantum layers and well layers are alternately stacked with each other, the quantum layer may include a material such as AlGaN or AlGaInN, and the well layer may include a material such as GaN or AlInN. In an embodiment, in case that the active layer 330 includes AlGaInN as a material of the quantum layer, and AlInN as a material of the well layer. As described above, the active layer 330 may emit blue light having a central wavelength band in a range of about 450 nm to about 495 nm.

However, the disclosure is not limited thereto. The active layer 330 may have a structure in which first layers made of a semiconductor material having larger bandgap energy and second layers made of a semiconductor material having a smaller bandgap energy are alternately stacked with each other. The active layer 330 may include groups III to V semiconductor materials depending on a wavelength band of emitted light. The light emitted from the active layer 330 is not limited to light of a wavelength band corresponding to a blue color. In some embodiments, the light emitted from the active layer 330 may be light of a red or green wavelength band. A length of the active layer 330 may be in a range of about 0.05 µm to about 0.25 µm. However, the disclosure is not limited thereto.

In an embodiment, the light emitted from the active layer 330 may emit not only from an outer side of the light emitting element 300 in a length direction, but also from both opposing sides thereof. A direction of the light emitted from the active layer 330 is not limited to a direction.

The conductive electrode layer 370 may be an ohmic contact electrode. However, the disclosure is not limited thereto. The conductive electrode layer 370 may be a Schottky contact electrode. The conductive electrode layer 370 may include a conductive metal. For example, the conductive electrode layer 370 may include at least one of aluminum (Al), titanium (Ti), indium (In), gold (Au), silver, (Ag), ITO (Indium Tin Oxide), IZO (Indium Zinc Oxide), and ITZO (Indium Tin-Zinc Oxide). Further, the conductive electrode layer 370 may include a semiconductor material doped with n-type or p-type dopants. The conductive electrode layer 370 may include the same material or different materials. However, the disclosure is not limited thereto.

The insulating film 380 may be disposed to surround outer sides of the semiconductors as described above. In an embodiment, the insulating film 380 may be disposed to surround at least an outer side of the active layer 330 and may extend in a direction in which the light emitting element 300 extends. The insulating film 380 may perform a function of protecting the members. In an embodiment, the insulating film 380 may be formed to surround side sides of the members such that both opposing ends of the light emitting element 300 in a length direction of the light emitting element 300 may be exposed.

The drawing shows that the insulating film 380 extends in the longitudinal direction of the light emitting element 300 and covers (or overlaps) an area from the first conductive type semiconductor 310 to the conductive electrode layer 370. However, the disclosure is not limited thereto. The insulating film 380 may cover an outer side of only one of the conductive type semiconductors and an outer side of the active layer 330 or may cover only a portion of an outer side of the conductive electrode layer 370 so that another portion of the outer side of the conductive electrode layer 370 may be exposed.

A thickness of insulating film 380 may be in a range of about 10 nm to about 1.0 µm. However, the disclosure is not limited thereto. The thickness of the insulating film 380 may be about 40 nm.

The insulating film 380 may include a material having insulating properties, for example, silicon oxide ($SiO_x$), silicon nitride ($SiN_x$), silicon oxynitride ($SiO_xN_y$), aluminum nitride (AlN), aluminum oxide ($Al_2O_3$), etc. Accordingly, the insulating film 380 may prevent an electrical short circuit that may otherwise occur in case that the active layer 330 directly contacts the electrode through which an electrical signal is transmitted to the light emitting element 300. Further, the insulating film 380 protects the outer side of the light emitting element 300 including the active layer 330 such that a decrease in luminous efficiency may be prevented.

In some embodiments, the insulating film 380 may be surface-treated. The light emitting elements 300 may be sprayed onto the electrodes while being dispersed in ink during a manufacturing process of the display device 10 and may be aligned with each other. In this connection, in order to maintain a state in which the light emitting element 300 does not aggregate with other adjacent light emitting elements 300 in the ink, but the light emitting elements 300 are dispersed in the ink, the insulating film 380 may have a hydrophobic or hydrophilic surface.

In an embodiment, the light emitting element 300 may have a length h of about 1 µm to about 10 µm or about 2 µm to about 6 µm, preferably about 4 µm to about 5 µm. Further, a diameter of the light emitting element 300 may be in a range of about 300 nm to about 700 nm, and an aspect ratio of the light emitting element 300 may be in a range of about 1.2 to about 100. However, the disclosure is not limited thereto. The light emitting elements 300 included in the display device 10 may have different diameters because of differences between compositions of the active layers 330 thereof. The diameter of the light emitting element 300 may be about 500 nm.

Figure 4:
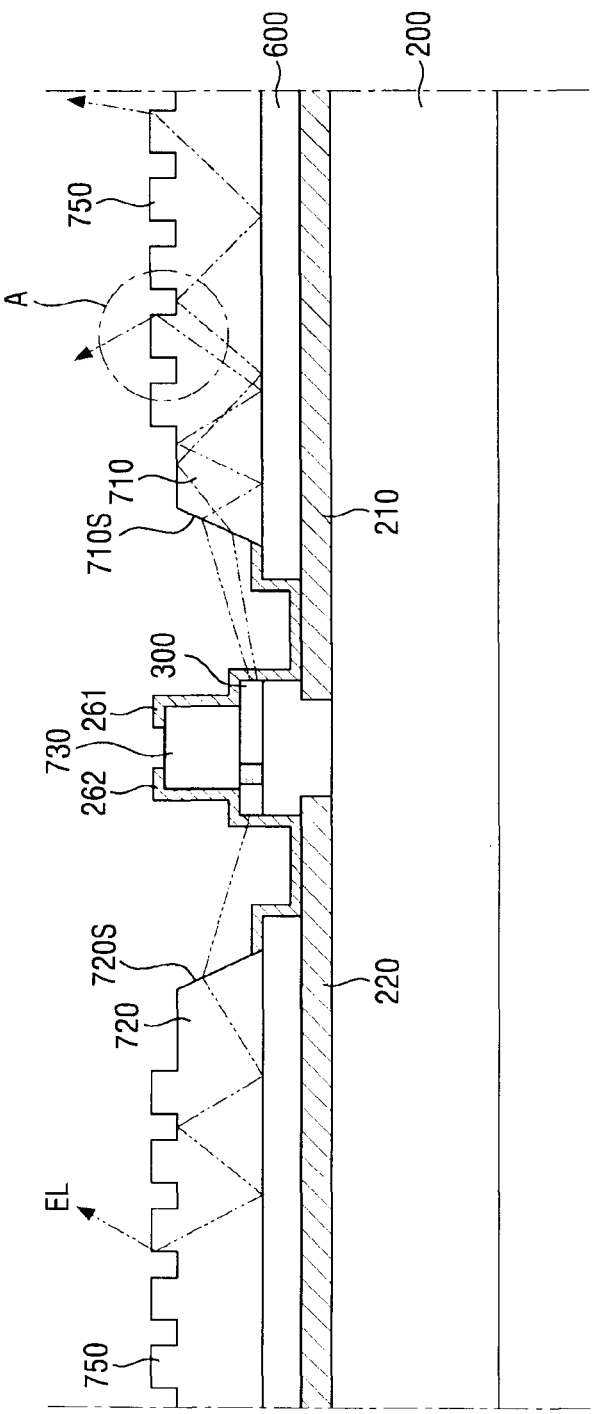
FIG. 4 is a schematic diagram illustrating a cross section of a portion of a display device according to an embodiment.
Figure 5:
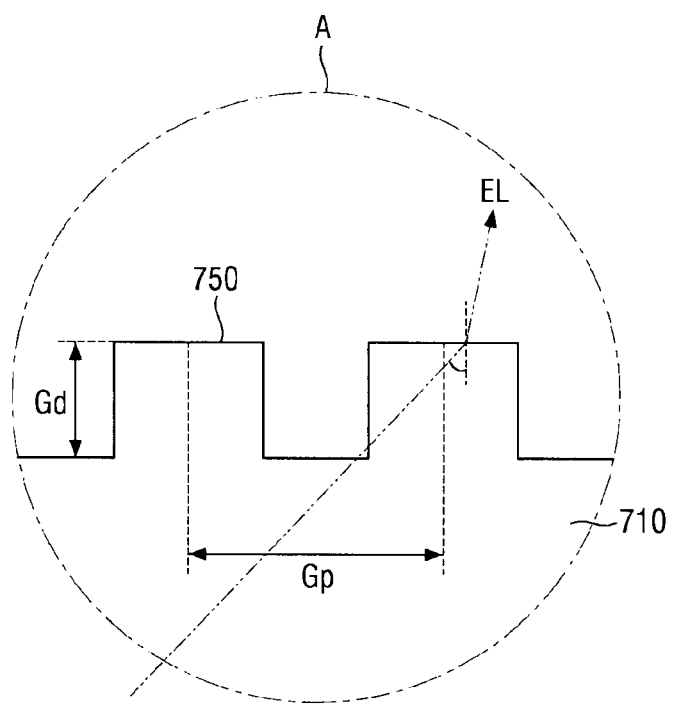
FIG. 5 is a schematic enlarged view of a portion A of FIG. 4.

FIG. 4 is a schematic diagram illustrating a cross section of a portion of a display device according to an embodiment. FIG. 5 is a schematic enlarged view of portion A of FIG. 4. FIG. 6 is a schematic plan view illustrating a top side of an insulating pattern according to an embodiment.

In FIG. 4, some members of the display device 10 are omitted or briefly illustrated in order to illustrate travel of the light emitted from the light emitting element 300 into the second insulating layer 700. FIG. 4 illustrates only the via layer 200, the first electrode 210, the second electrode 220, the first insulating layer 600, the light emitting element 300, the second insulating layer 700, and the contact electrode 260, but a structure of the display device 10 is not limited thereto. The display device 10 may include the members as described above with reference to FIG. 2. Hereinafter, the insulating layers 600 and 700 of the display device 10 will be described in detail with reference to FIG. 4 and other drawings.

Referring to FIGS. 4 to 6, at least a portion of the light emitted from the light emitting element 300 may be incident on the second insulating layer 700. The light may be incident on one side (or first side) 710S of the first insulating pattern 710 and one side (or first side) 720S of the second insulating pattern 720. The second insulating layer 700 may include an inorganic material or an organic insulating material having a predefined refractive-index. Light beams incident on the first insulating pattern 710 and the second insulating pattern 720 may be refracted on one side (or first sides) 710S and 720S, respectively, and travel in the first insulating pattern 710 and the second insulating pattern 720, respectively.

Each of the first and second insulating patterns 710 and 720 may include a top side forming an interface with the passivation layer 800 disposed thereon, and a bottom side forming an interface with the underlying first insulating layer 600 as shown in FIG. 2. Light incident on the first and second insulating patterns 710 and 720 may be reflected or refracted on the top side and the bottom side of each of the insulating patterns 710 and 720 at which the interface is formed between the layers having different refractive indexes. The light beams reflected from the interface may not be output from the insulating patterns 710 and 720 such that the light efficiency of the display device 10 may decrease.

According to an embodiment, the second insulating layer 700 may include the concave-convex pattern 750 disposed on each of the insulating patterns 710 and 720 and thus provide an optical path through which light incident on the second insulating layer 700 is output. The light may be reflected and move in the second insulating layer 700 and then may be output therefrom through the concave-convex pattern 750 (EL in FIG. 4). The concave-convex pattern 750 has a shape in which a portion of a top side of the second insulating layer 700 protrudes upwards. A protruding area may change an incident angle at which the light is incident in a totally reflected manner toward the top side of the second insulating layer 700. Light incident on the concave-convex pattern 750 may be refracted at an interface between the concave-convex pattern 750 and an outside thereof and then may be output therefrom. The second insulating layer 700 may provide a travel path of the incident light and output the light through the concave-convex pattern 750P, such that the light efficiency of the display device 10 may be improved.

The concave-convex pattern 750 is substantially integral with the second insulating layer 700. The concave-convex pattern 750 may be formed by patterning the top side of the second insulating layer 700 or pressing the top side with a mold in a process of forming the second insulating layer 700. However, the disclosure is not limited thereto.

FIG. 4 illustrates that a side of the concave-convex pattern 750 extends in a direction perpendicular to the top side of the second insulating layer 700 or the first insulating pattern 710, and a top side of the concave-convex pattern 750 extends in a parallel manner to the top side of the first insulating pattern 710. For example, a concave or convex portion of the concave-convex pattern 750 may have a shape of a quadrangle having a right angled corner. However, the disclosure is not limited thereto. A side of the concave or convex portion of the concave-convex pattern 750 may be inclined, or the concave or convex portion of the concave-convex pattern 750 may have a partially curved shape.

According to an embodiment, the concave-convex pattern 750 may at least a portion thereof extending in a direction. As shown in FIG. 6, the concave-convex pattern 750 may be formed on the top side of the second insulating layer 700, and the concave-convex pattern 750 and the first and second insulating patterns 710 and 720 may be patterned to extend in substantially a same direction. In an embodiment, the concave-convex pattern 750 may be disposed on the first and second insulating patterns 710 and 720 and may extend in a parallel manner to a direction in which the insulating patterns 710 and 720 extend, for example, the second direction D2. However, the disclosure is not limited thereto. The concave-convex pattern 750 may extend in a direction different from a direction in which the insulating patterns 710 and 720 extend, or the concave-convex pattern 750 may be divided into repeated units which may be spaced from each other.

In an embodiment, each of the concave-convex patterns 750 may have a predefined vertical dimension or depth Gd or a predefined pitch Gp. The depth Gd and the pitch Gp of the concave-convex pattern 750 may vary based on a refractive index (N) of a material forming the second insulating layer 700 and a wavelength ($\lambda$) of light incident on the concave-convex pattern 750. In an embodiment, each of the pitch Gp and the depth Gd of the concave-convex pattern 750 may be inversely proportional to the refractive index of the material of the second insulating layer 700 and may be proportional to the wavelength ($\lambda$) of the incident light. For example, in case that the refractive index of the second insulating layer 700 is larger or the wavelength (X) of the incident light is smaller, each of the pitch Gp and the depth Gd of the concave-convex pattern 750 may be smaller. Thus, the concave-convex patterns 750 may be dense on the second insulating layer 700. In contrast, in case that the refractive index of the second insulating layer 700 is smaller or the wavelength ($\lambda$) of light is larger, each of the pitch Gp and the depth Gd of the concave-convex pattern 750 may be larger.

Figure 7:
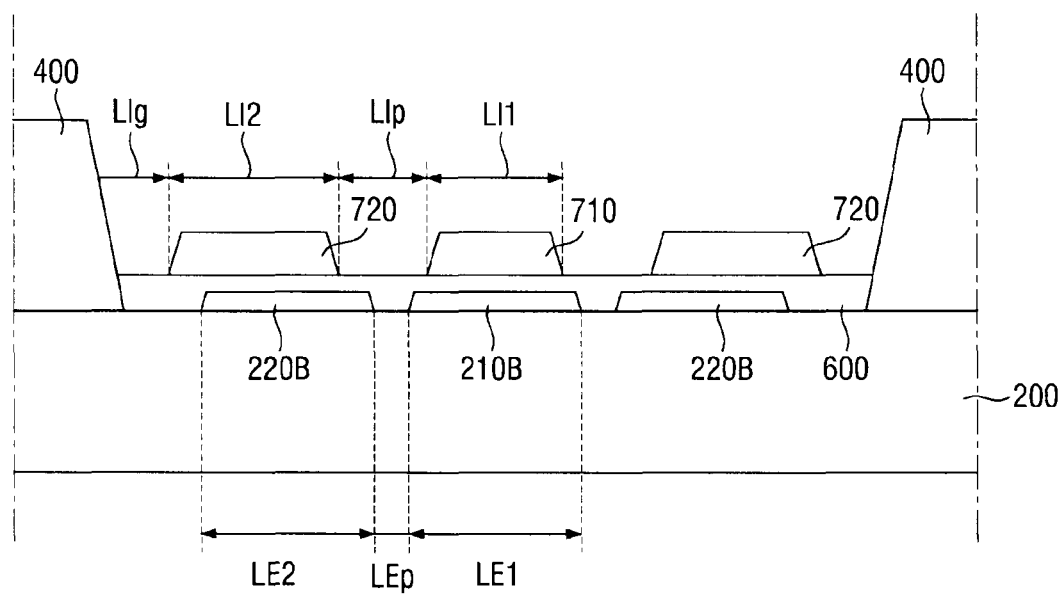
FIG. 7 is a schematic diagram illustrating a cross section of a sub-pixel according to an embodiment.

FIG. 7 is a schematic diagram illustrating a cross section of a sub-pixel according to an embodiment.

In FIG. 7, in order to illustrate a structure in which the first insulating pattern 710 and the second insulating pattern 720 of the second insulating layer 700 are arranged in each sub-pixel PXn, some members of the display device 10 are omitted or shown in a simpler manner. FIG. 7 illustrates the via layer 200, the first electrode 210, the second electrode 220, the bank 400, the first insulating layer 600, and the second insulating layer 700. However, the structure of the display device 10 is not limited thereto.

Referring to FIG. 7, each sub-pixel PXn includes the bank 400, the first electrode 210, the second electrode 220, the first insulating layer 600, and the second insulating layer 700. A sub-pixel PXn may include a first electrode branch 210B and two second electrode branches 220B and may include a first insulating pattern 710 and two second insulating pattern 720 overlapping the first electrode branch 210B and the two second electrode branches 220B, respectively.

The first electrode branch 210B and the second electrode branch 220B disposed in each sub-pixel PXn may have the same width. A width LE1 of the first electrode branch 210B is equal to a width LE2 of the second electrode branch 220B. In an embodiment, a width LI1 of the first insulating pattern 710 may be smaller than a width LI2 of the second insulating pattern 720. As described above, the insulating patterns 710 and 720 may respectively overlap the electrode branches 210B and 220B, while at least one side of each of the insulating patterns 710 and 720 may overlap each of the electrode branches 210B and 220B but be horizontally spaced from a side of each of the electrode branches 210B and 220B. Accordingly, a side of each of the first and second insulating patterns 710 and 720 may be spaced apart from the light emitting element 300 disposed between the electrode branches 210B and 220B.

Unlike the second electrode branch 220B, the first electrode branch 210B may have both opposing sides horizontally spaced apart from both opposing sides of the second electrode branch 220B, respectively. A side of the second electrode branch 220B may face the first electrode branch 210B, and the opposite side thereof may face the bank 400. Accordingly, both opposing sides of the first insulating pattern 710 may overlap the first electrode branch 210B but may be horizontally spaced from both opposing sides of the first electrode branch 210B, respectively. A side of the second insulating pattern 720 may be disposed between the second electrode branch 220B and the bank 400. For example, the width LI1 of the first insulating pattern 710 may be smaller than the width LI2 of the second insulating pattern 720.

According to an embodiment, a distance LIp between the first insulating pattern 710 and the second insulating pattern 720 may be greater than a distance LEp between the first electrode branch 210B and the second electrode branch 220B. Further, a distance LIg between the second insulating pattern 720 and the bank 400 may be smaller than the distance LIp between the first and second insulating patterns 710 and 720. As described above, at least one side of each of the first and second insulating patterns 710 and 720 may overlap each of the electrode branches 210B and 220B but may be horizontally spaced from a side of each of the electrode branches 210B and 220B. Thus, distances therebetween may be different from each other. In an embodiment, each of the widths LI1 and LI2 of the first insulating pattern 710 and the second insulating pattern 720 may be in a range of about 10 µm to about 2 µm. However, the disclosure is not limited thereto.

The display device 10 according to an embodiment includes the second insulating layer 700 including the concave-convex pattern 750 as described above, which may provide a light travel path along which the light emitted by the light emitting element 300 is output toward a top of each pixel PX or sub-pixel PXn. Accordingly, the display device 10 may have improved top emission efficiency. Further, the device may be free of a separate bank structure or a reflective layer to reflect upward the light emitted from the light emitting element 300. Thus, a manufacturing cost of the display device 10 may be reduced.

Hereinafter, a method for manufacturing the display device 10 according to an embodiment will be described.

Figure 8:
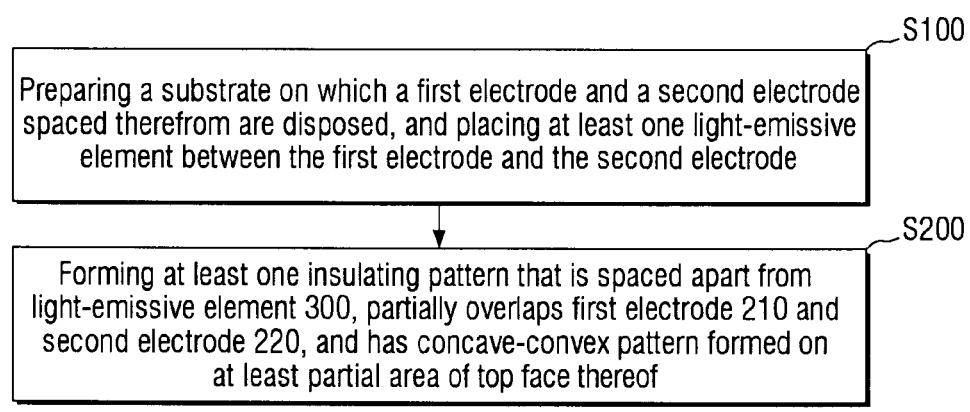
FIG. 8 is a flowchart illustrating a manufacturing process of the display device according to an embodiment.

FIG. 8 is a schematic flowchart illustrating a manufacturing process of a display device according to an embodiment. FIGS. 9 to 16 are schematic cross-sectional views illustrating a manufacturing process of a display device according to an embodiment.

Referring to FIG. 8, the method for manufacturing the display device 10 according to an embodiment includes preparing a substrate on which the first electrode 210 and the second electrode 220 are disposed and placing the light emitting element 300 in a space between the first electrode 210 and the second electrode 220 (S100), and forming at least one insulating pattern 710 and 720 that is spaced apart from the light emitting element 300, partially overlaps the first electrode 210 and the second electrode 220, and has the concave-convex pattern 750 formed on at least a portion of a top side thereof (S200).

The display device 10 according to an embodiment may be manufactured by placing the light emitting element 300 on the substrate on which the first electrode 210 and the second electrode 220 are formed, and then forming the insulating patterns 710 and 720 having the concave-convex patterns 750, respectively. Each of the insulating patterns 710 and 720 may be formed by forming a second insulating material layer 700' so as to entirely overlap the first electrode 210 and the second electrode 220, and by etching at least a portion of the second insulating material layer 700' or performing a process of pressing the at least a portion of the second insulating material layer 700' with a predefined mold. In an embodiment, the insulating patterns 710 and 720 may be formed by performing a patterning method or a nano-imprinting method such that the concave-convex pattern 750 may be disposed thereon while the insulating patterns 710 and 720 may be spaced apart from the light emitting element 300. Hereinafter, the manufacturing process of the display device 10 will be described in detail with reference to other drawings.

Figure 9:
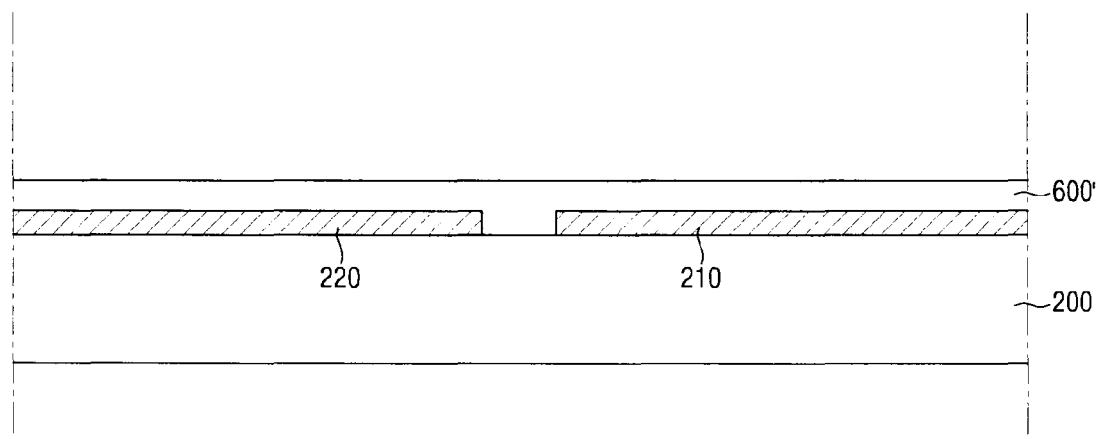

First, referring to FIG. 9, the first electrode 210 and the second electrode 220 disposed on the via layer 200 are prepared, and a first insulating material layer 600' disposed to cover (or overlap) an entire area of the first electrode 210 and the second electrode 220 is formed. The first electrode 210 and the second electrode 220 are spaced apart from each other. It may be understood that the first electrode 210 and the second electrode 220 in FIG. 9 may act as substantially the first electrode branch 210B and the second electrode branch 220B, respectively. Descriptions of the structures thereof are the same as described above.

Although not shown in the drawing, the bank 400 as described above in FIG. 2 may be disposed on the via layer 200. In an embodiment, the bank 400 may be disposed directly on the via layer 200. In some embodiments, the bank 400 may be formed simultaneously together with the first insulating material layer 600'. However, in following drawings including FIG. 9, the bank 400 will be omitted, and the formation of the insulating patterns 710 and 720 will be described in detail.

The first insulating material layer 600' may be patterned in a step to be described below to form the first insulating layer 600. The first insulating material layer 600' may be disposed to cover (or overlap) an entire area of the top sides of the via layer 200 and the first electrode 210 and the second electrode 220. In a subsequent process, the patterned portion 600P exposing a portion of each of the first electrode 210 and the second electrode 220 is formed. In an embodiment, the first insulating material layer 600' may include an inorganic insulating material. However, the disclosure is not limited thereto. The first insulating material layer 600' may include an organic insulating material.

Figure 10:
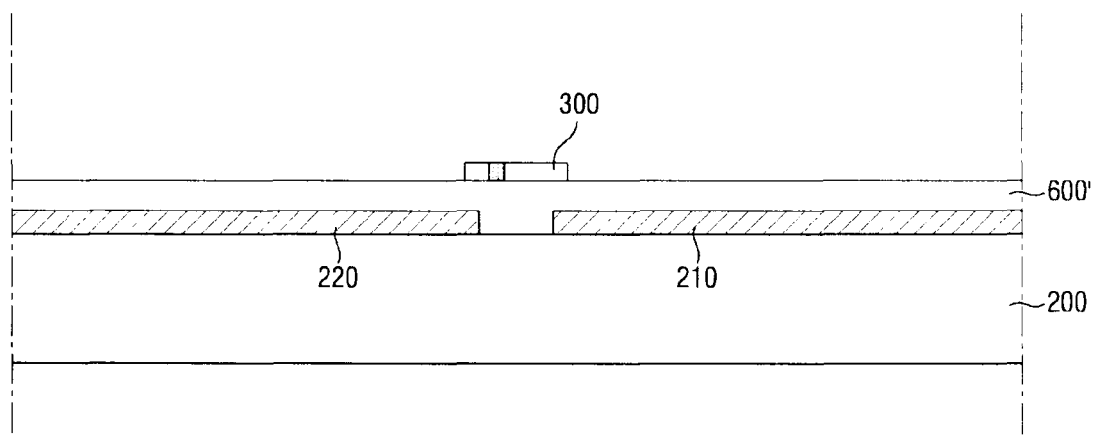

Next, referring to FIG. 10, at least one light emitting element 300 may be placed in an area between the first electrode 210 and the second electrode 220 and on the first insulating material layer 600'. In the step of placing the light emitting element 300, ink containing the light emitting elements 300 may be sprayed, and then an electrical signal may be applied to each of the electrodes 210 and 220. Thus, an electric field may be generated on the ejected or sprayed ink via the electrical signal applied to each of the electrodes 210 and 220. Thus, the light emitting elements 300 may be subjected to a dielectrophoretic force resulting from the electric field. Thus, the light emitting element 300 subjected to the dielectrophoretic force may be oriented in a direction and may be arranged between the electrodes 210 and 220.

Figure 11:
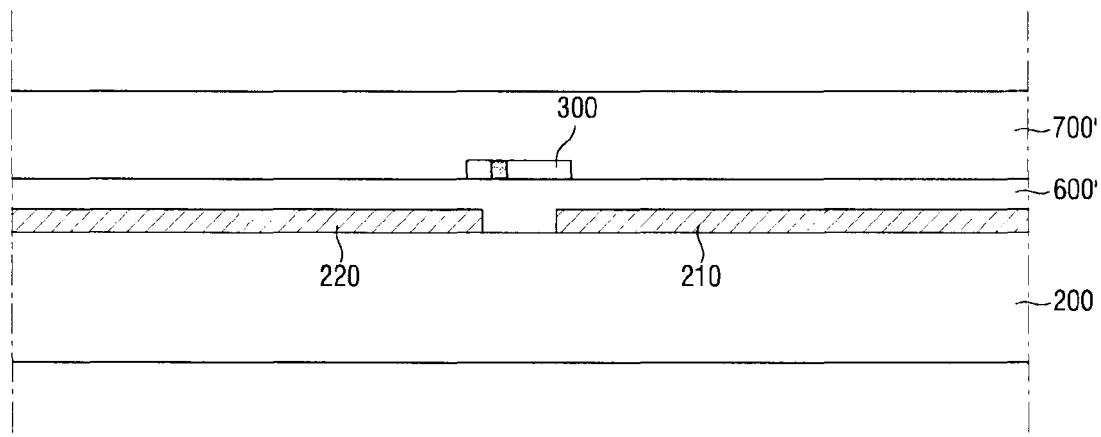

Next, referring to FIG. 11, the second insulating material layer 700' covering (or overlapping) an entire area of the top sides of the first insulating material layer 600' and the light emitting elements 300 is formed. The second insulating material layer 700' may be partially removed in a subsequent process to form the insulating patterns 710, 720, and 730. In an embodiment, the second insulating material layer 700' may include an organic insulating material. In case that the second insulating material layer 700' includes the organic insulating material, the second insulating material layer 700' may be formed in an uncured state such that the concave-convex pattern 750 is formed in a subsequent process. However, the disclosure is not limited thereto.

Figure 12:
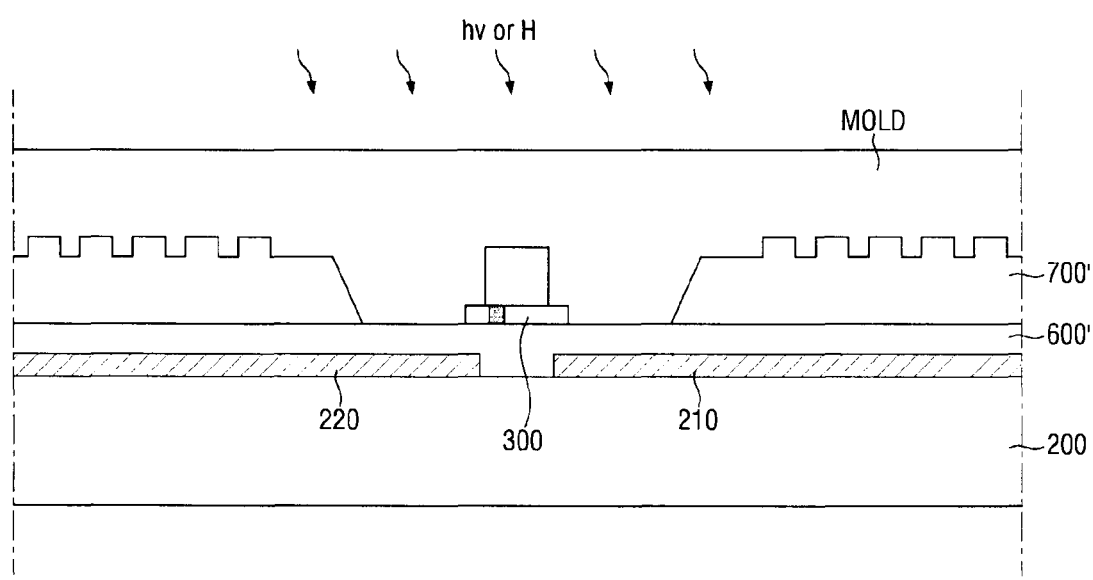
Figure 13:
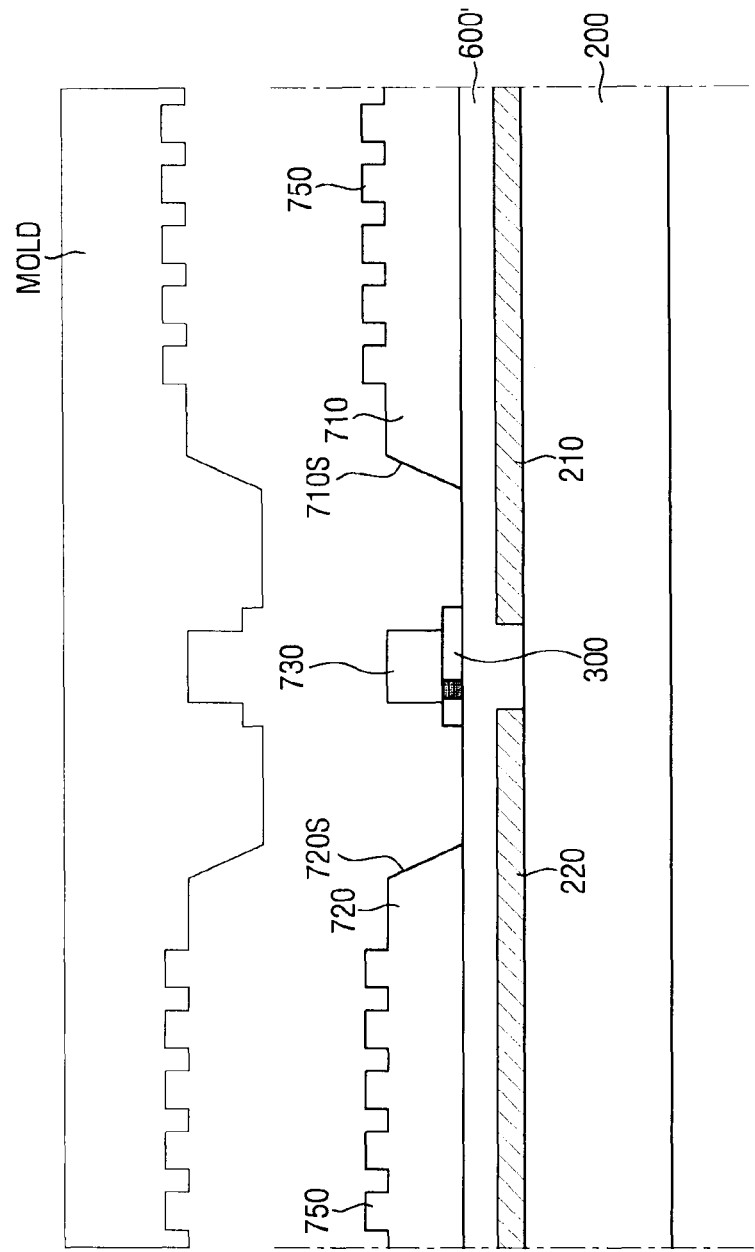

Next, referring to FIGS. 12 and 13, a portion of the second insulating material layer 700' is processed to form insulating patterns 710, 720, and 730. The insulating patterns may include the first insulating pattern 710 and the second insulating pattern 720 respectively including the concave-convex patterns 750, and the third insulating pattern 730 disposed on the light emitting element 300 and exposing at least a portion of the light emitting element 300. The descriptions of the structures and shapes of the first insulating pattern 710, the second insulating pattern 720, and the third insulating pattern 730 are the same as those as described above, and thus detailed descriptions thereof will be omitted.

According to an embodiment, in the step of forming the insulating patterns 710, 720, and 730, at least a portion of the light emitting element 300 may be exposed, and each of the concave-convex patterns 750 may be formed on at least a portion of each of the insulating patterns 710, 720, and 730. For example, a step of forming the concave-convex pattern 750 of the display device 10 and a step of exposing both opposing sides of the light emitting element 300 contacting the contact electrode 260 may be performed by a same process. In an embodiment, this process may be performed using a nano-imprinting method or a patterning method. Hereinafter, an example in which this process is carried out using the nano-imprinting method will be described.

As shown in FIG. 12, the top side of the second insulating material layer 700' is pressed using a mold MOLD having a side having a partial protrusion, and then is irradiated with ultraviolet hv or is subjected to a heat-treatment H process. The mold MOLD has a first area having a concave-convex structure inverse to that of the concave-convex pattern 750 disposed on each of the first insulating pattern 710 and the second insulating pattern 720; and a second area having a structure which allows the opposing sides of the light emitting element 300 to be exposed and is inverse to a structure of the third insulating pattern 730 so as to form the third insulating pattern 730. A concave-convex structure corresponding to the inverse concave-convex structure formed in the mold MOLD may be formed on the second insulating material layer 700' including the uncured organic material. The concave-convex pattern 750 may be formed in an area of the second insulating material layer 700' contacting the first area of the mold MOLD, while the third insulating pattern 730 may be formed in an area of the second insulating material layer 700' contacting the second area of the mold, and the both opposing sides of the light emitting element 300 may be exposed in the area of the second insulating material layer 700' contacting the second area thereof.

As shown in FIG. 13, after the mold MOLD has pressed the second insulating material layer 700' and the ultraviolet hv irradiation and the heat-treatment H process have been carried out, the second insulating material layer 700' may be sufficiently hardened. The mold MOLD is removed from the second insulating material layer 700' to form the second insulating layer 700. The second insulating layer 700 may include the first insulating pattern 710, the second insulating pattern 720, and the third insulating pattern 730. Each of the both exposed opposing sides of the light emitting element 300 may be spaced apart from each of one sides (or first sides) 710S and 720S of the first insulating pattern 710 and the second insulating pattern 720. A portion of the first insulating material layer 600' may be exposed in the area between the sides 710S and 720S of the first insulating pattern 710, and may be etched in a subsequent process such that the patterned portion 600P may be formed.

In an embodiment, the process of forming the second insulating layer 700 is not limited thereto. In the process of forming the second insulating layer 700, the concave-convex pattern 750 may be formed not using the mold MOLD but using a patterning process.

Figure 14A:
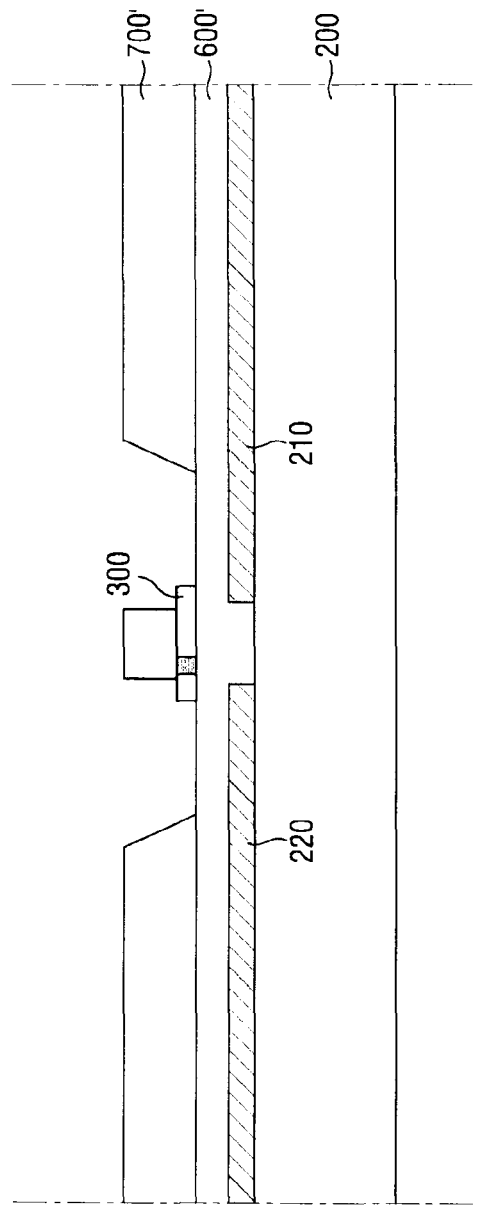
Figure 14B:
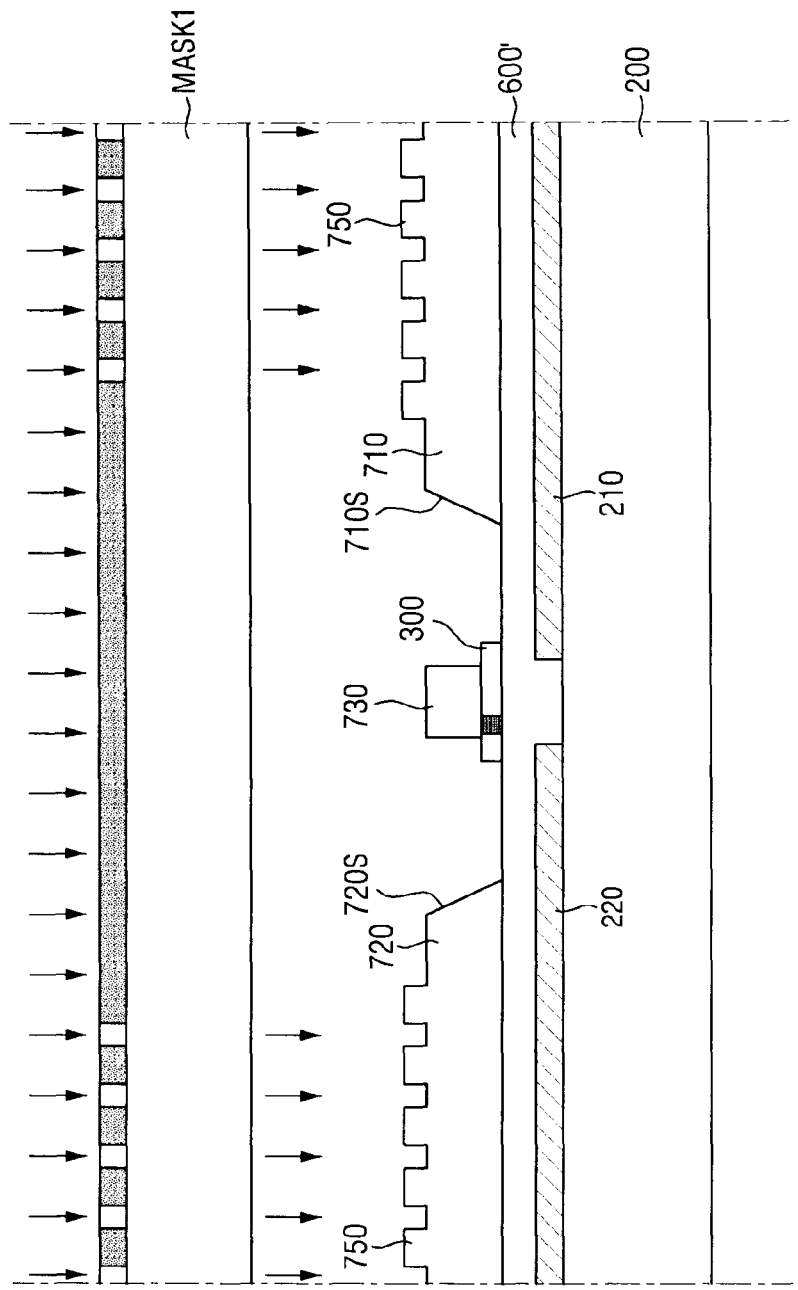
Figure 14C:
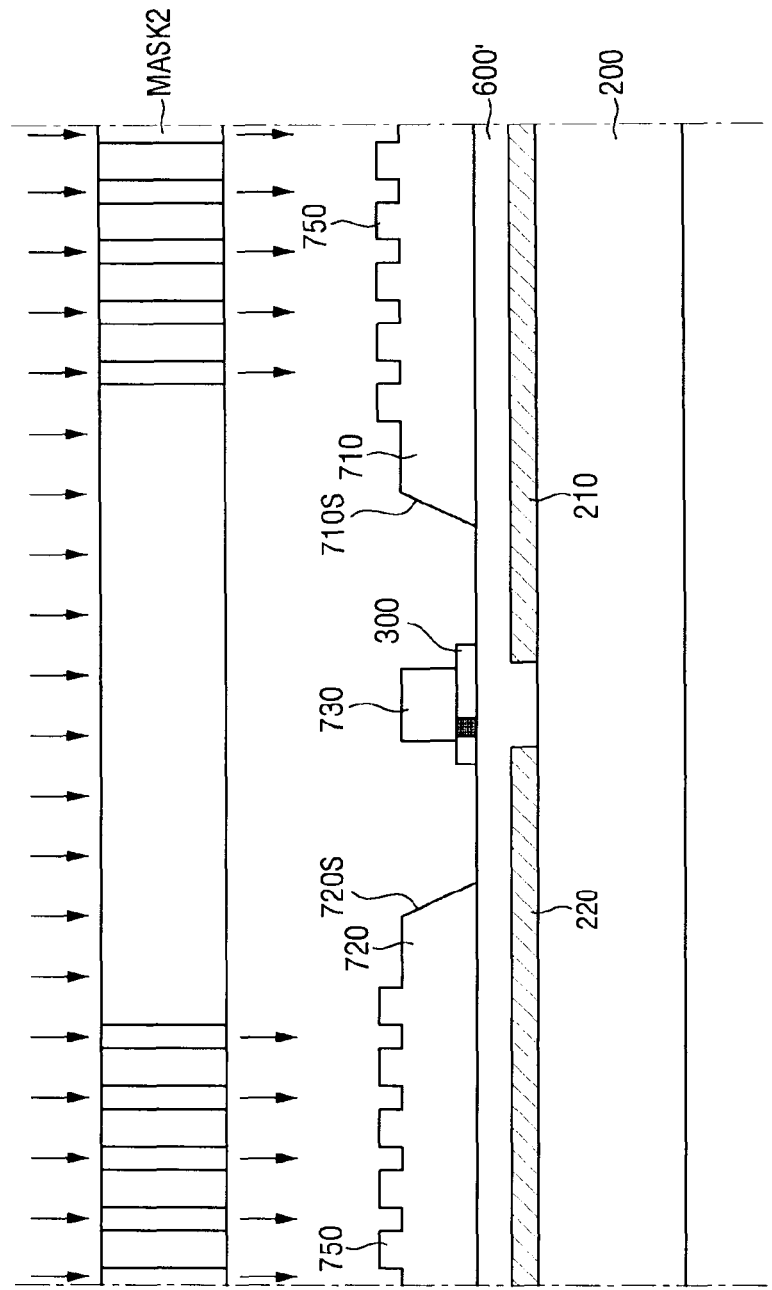

FIGS. 14A, 14B, and 14C schematically illustrates a process of forming the second insulating layer 700. The second insulating layer 700 includes the third insulating pattern 730 and the concave-convex pattern 750, such that a top side thereof may not be flat, and a step (or height difference) may be formed on the top side thereof. The concave-convex pattern 750 having a fine size and a fine pitch may be formed by patterning the top side of the second insulating material layer 700' at different pressing strengths in different areas thereof. In an embodiment, the process of forming the second insulating layer 700 may be performed by means of a patterning process using a halftone mask or a slit mask. First, as shown in FIG. 14A, a portion of the second insulating material layer 700' may be patterned to expose both opposing sides of the light emitting element 300. The first insulating pattern 710, the second insulating pattern 720, and the third insulating pattern 730 may be formed. Then, each of the top sides of the first insulating pattern 710 and the second insulating pattern 720 may be partially patterned to form the concave-convex pattern 750. In this connection, the concave-convex pattern 750 may be formed using a halftone mask MASK1 as shown in FIG. 14B, or using a slit mask MASK2 as shown in FIG. 14C.

Each of the top sides of the first insulating pattern 710 and the second insulating pattern 720 may be exposed to light beams by using the halftone mask MASK1 or the slit mask MASK2. In this case, even in case that light is irradiated toward an entire area of the mask, only some of light beams corresponding to portions of the mask pass through the mask. Thus, the concave-convex pattern 750 having a fine size and a fine pitch may be formed on the top side of each of the first insulating pattern 710 and the second insulating pattern 720. The method for manufacturing the display device 10 according to an embodiment may obtain the first insulating pattern 710 and the second insulating pattern 720 in which the concave-convex pattern 750 is formed, by designing a shape of the halftone mask MASK1 or the slit mask MASK2. However, the disclosure is not limited thereto.

Figure 16:
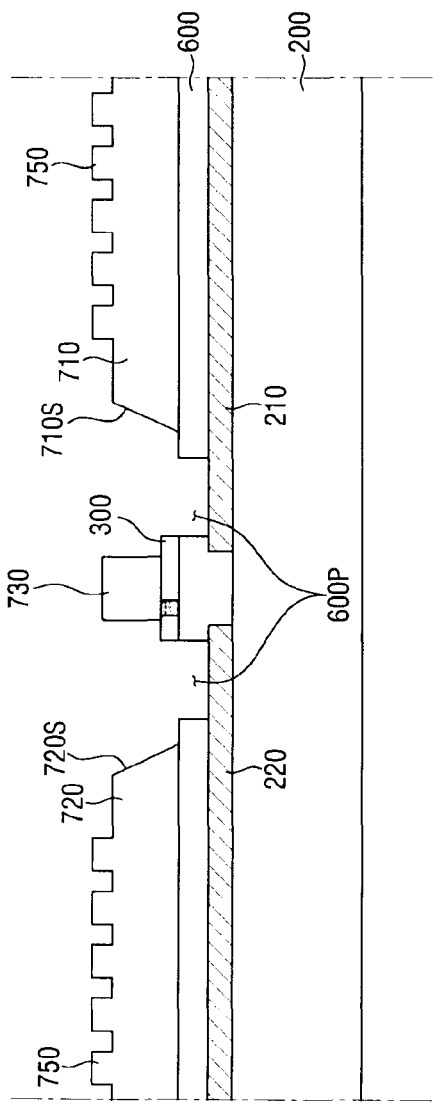

Next, as shown in FIGS. 15 and 16, a portion of the first insulating material layer 600' exposed through a space between each of both opposing sides of the light emitting element 300 and each of the first insulating pattern 710 and the second insulating pattern 720 may be etched away to form the patterned portion 600P. The first insulating material layer 600' may be discontinuous at the patterned portion 600P to form the first insulating layer 600.

Next, although not shown in the drawing, the first contact electrode 261 and the second contact electrode 262 contacting the both exposed opposing sides of the light emitting element 300 are formed, and the passivation layer 800 covering (or overlapping) the first contact electrode 261 and the second contact electrode 262 is formed. In this way, the display device 10 may be manufactured. In forming the second insulating layer 700 including the insulating patterns 710, 720, and 730 during the manufacturing of the display device 10 using the process as described above, both a process of exposing the both opposing sides of the light emitting element 300 and a process of forming the concave-convex pattern 750 on the first insulating pattern 710 and the second insulating pattern 720 may be simultaneously performed.

Further, forming the first insulating pattern 710 and the second insulating pattern 720 respectively including the concave-convex patterns 750 may allow omitting a reflective electrode that reflects the light emitted from the light emitting element 300, such that the number of steps for manufacturing the display device 10 may be reduced, thereby improving manufacturing efficiency.

In an embodiment, as described above, a shape of the concave-convex pattern 750 of the display device 10 is not limited to a shape shown in FIG. 4. In some embodiments, the concave or convex portion of the concave-convex pattern 750 may have an inclined side, or have a curved shape.

Figure 17:
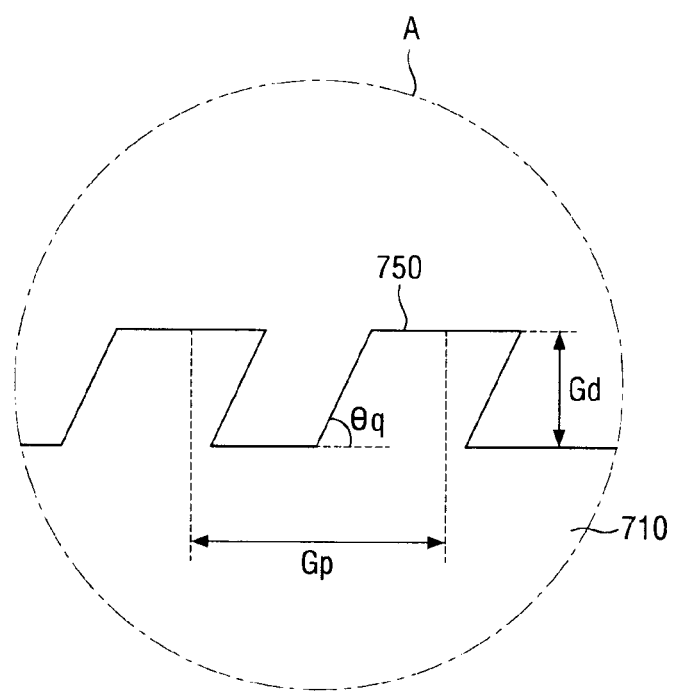
FIG. 17 to FIG. 19 are schematic cross-sectional views illustrating a concave-convex pattern according to another embodiment.
Figure 18:
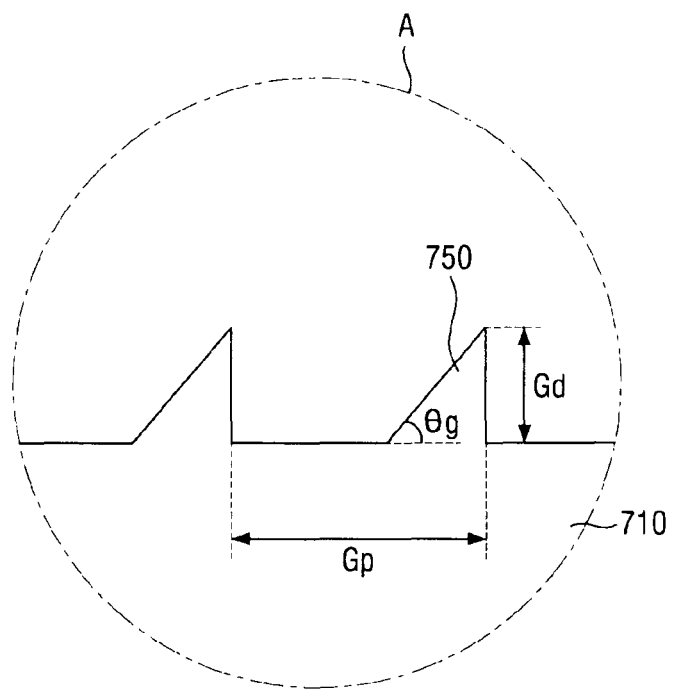
Figure 19:
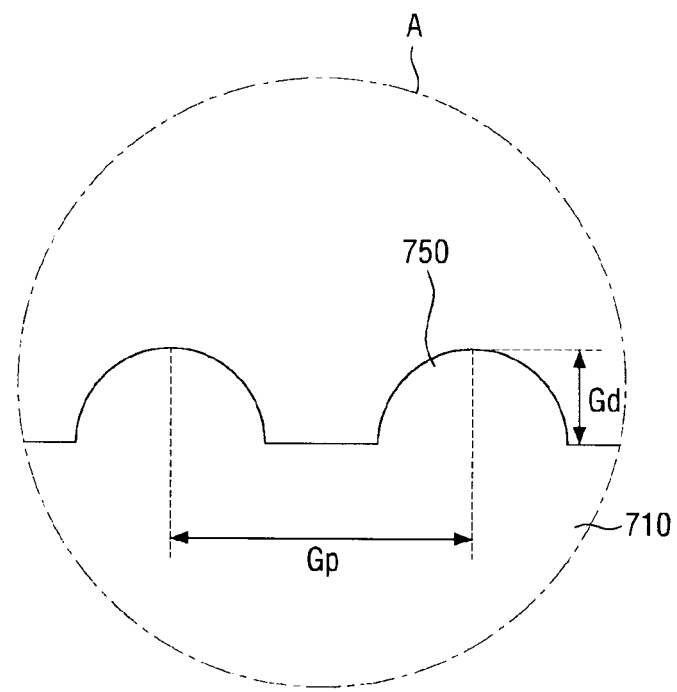

FIGS. 17 to 19 are schematic cross-sectional views illustrating a concave-convex pattern according to an embodiment. FIGS. 17 to 19 illustrates enlarged cross sections of a portion corresponding to portion A of FIG. 4 according to an embodiment.

Referring to FIGS. 17 to 19, a concave or convex portion of the concave-convex pattern 750 according to an embodiment may have an inclined side extending from a top side of the second insulating layer 700 or the first insulating pattern 710. The concave or convex portion of the concave-convex pattern 750 in FIG. 17 has both opposing sides having a predefined inclination angle Θq. A concave or convex portion of the concave-convex pattern 750 of FIG. 18 may have an inclined side and the opposite side which may extend in a perpendicular manner to the top side of the first insulating pattern 710. A concave or convex portion of the concave-convex pattern 750 in FIG. 19 may have a curved shape protruding upwards. Depending on the shape of the concave or convex portion of the concave-convex pattern 750, light incident on the first insulating pattern 710 may be incident on the concave-convex pattern 750 at various angles of incidence. A percentage of an amount of light which is not reflected from the concave-convex pattern 750 but is output through the concave-convex pattern 750 to the outside may increase.

Further, in case that as shown in FIGS. 18 and 19, the concave or convex portion of the concave-convex pattern 750 has a prism shape or a micro lens shape having a curved outer side, the concave-convex pattern 750 may scatter incident light thereon, thereby further increasing the top emission efficiency of the device.

Figure 21:
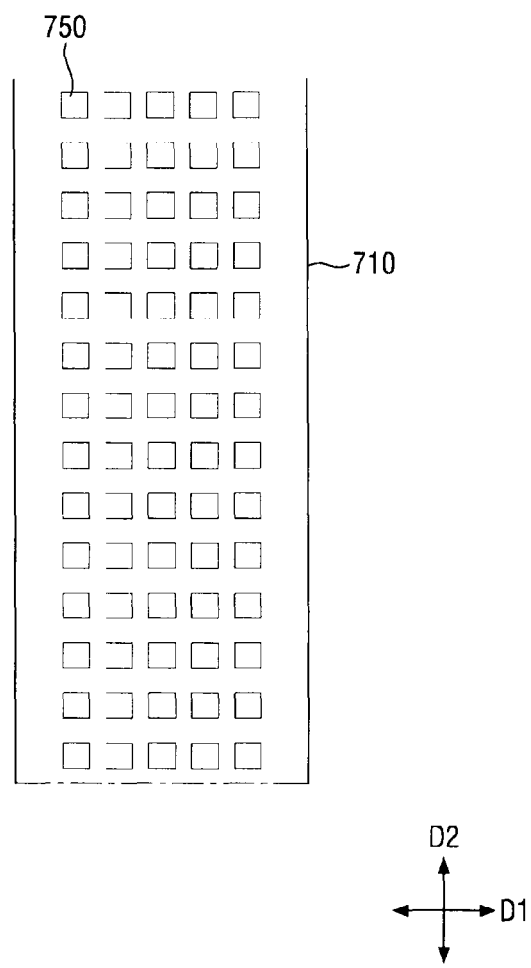

FIGS. 20 and 21 are schematic plan views illustrating a concave-convex pattern according to an embodiment.

First, referring to FIG. 20, the concave-convex pattern 750 may be disposed on the first insulating pattern 710 and the second insulating pattern 720 and extend in a direction. The direction in which the concave-convex pattern 750 extends is not particularly limited. In an embodiment, the concave-convex pattern 750 may extend in a direction different from the second direction D2 in which the first insulating pattern 710 extends. In an embodiment, as shown in FIG. 20, the concave-convex pattern 750 may extend in an oblique direction with respect to the second direction D2.

Further, referring to FIG. 21, the concave-convex pattern 750 does not extend in a direction and has repeating units. Concave-convex patterns 750 may be arranged and be spaced apart from each other. For example, the concave-convex patterns 750 may be arranged in a single grid pattern on the first insulating pattern 710 or the second insulating pattern 720.

Such various structures of the concave-convex pattern 750 may be formed using a mold MOLD having a convex or concave structure inverse to a convex or concave structure of the concave-convex pattern 750 during the manufacturing process of the display device 10. In case that the inverse convex or concave structure of the mold MOLD extends in a direction, the concave-convex pattern 750 formed on the first insulating pattern 710 and the second insulating pattern 720 may extend in a direction. In case that the inverse convex or concave structure of the mold MOLD has a grid pattern, the concave-convex pattern 750 formed on the first insulating pattern 710 and the second insulating pattern 720 may have a grid pattern. However, the disclosure is not limited thereto.

Hereinafter, other embodiments of the display device 10 will be described.

Figure 22:
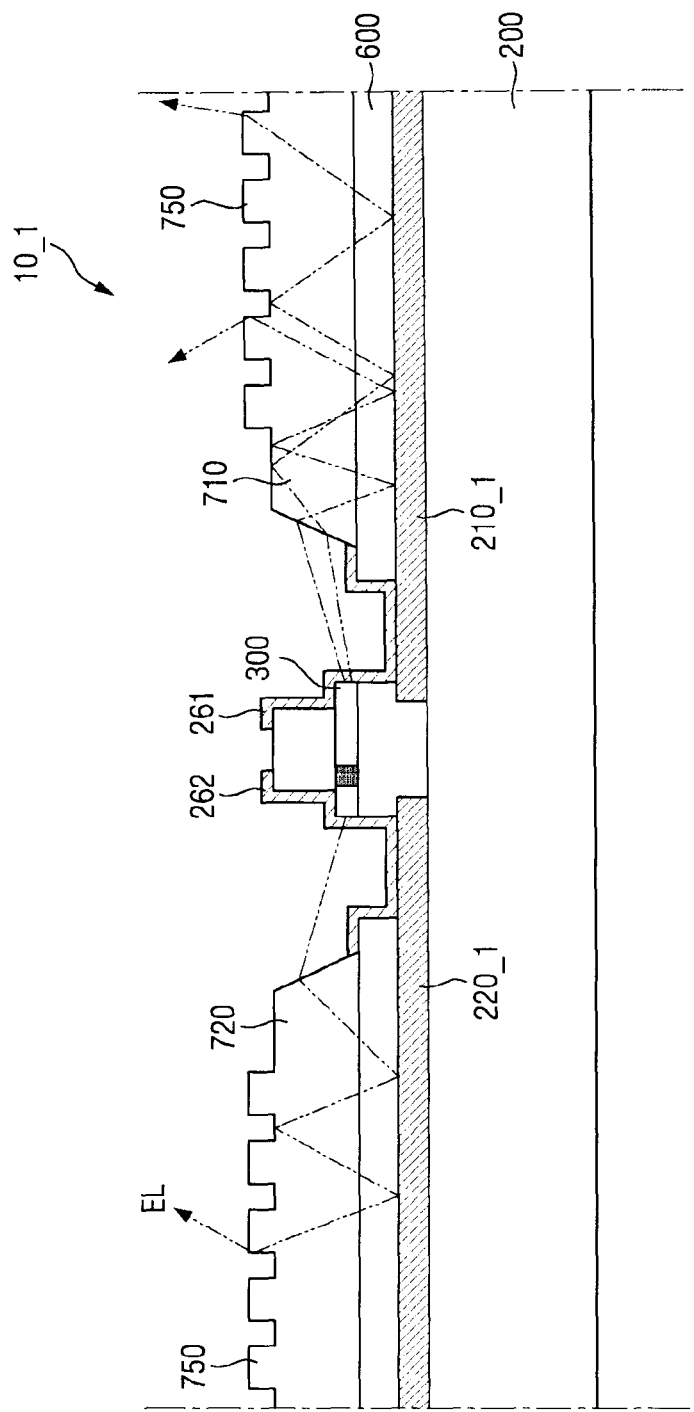
FIG. 22 is a schematic cross-sectional view of a display device according to another embodiment.

FIG. 22 is a schematic cross-sectional view of a display device according to an embodiment.

Referring to FIG. 22, according to an embodiment, a display device 10_1 may include electrodes 210_1 and 220_1 including a material having high reflectivity. For example, each of the electrodes 210_1 and 220_1 of the display device 10_1 may act as a reflective electrode that reflects incident light. The display device 10_1 of FIG. 22 is the same as the display device 10 of FIG. 2 except that a material forming the electrodes 210_1 and 220_1 is different from that in the display device 10 of FIG. 2. Thus, repetitive descriptions thereof will be omitted.

Light emitted from the light emitting element 300 may be reflected or refracted at an interface between each of the first insulating pattern 710 and the second insulating pattern 720 and another layer and then may travel. At least a portion of the light may not be reflected but be refracted at the interface between each of the first insulating pattern 710 and the second insulating pattern 720 and the first insulating layer 600 and then may be incident on each of the electrodes 210_1 and 220_1.

The display device 10_1 according to an embodiment may include the electrodes 210_1 and 220_1 made of a material having high reflectivity, such that light may be reflected from the electrodes 210_1 and 220_1. In an embodiment, each of the electrodes 210_1 and 220_1 may be made of the material with high reflectivity including a metal such as silver (Ag), copper (Cu), aluminum (Al), etc., or may have a stack structure of ITO/silver(Ag)/ITO/IZO, or may be made of an alloy including aluminum (Al), nickel (Ni), lanthanum (La), and the like. However, the disclosure is not limited thereto. The display device 10_1 may include the electrodes 210_1 and 220_1 made of a material having high reflectivity, and thus may have a reduced loss of light for each pixel PX or each sub-pixel PXn and thus may have improved top emission efficiency.

Figure 23:
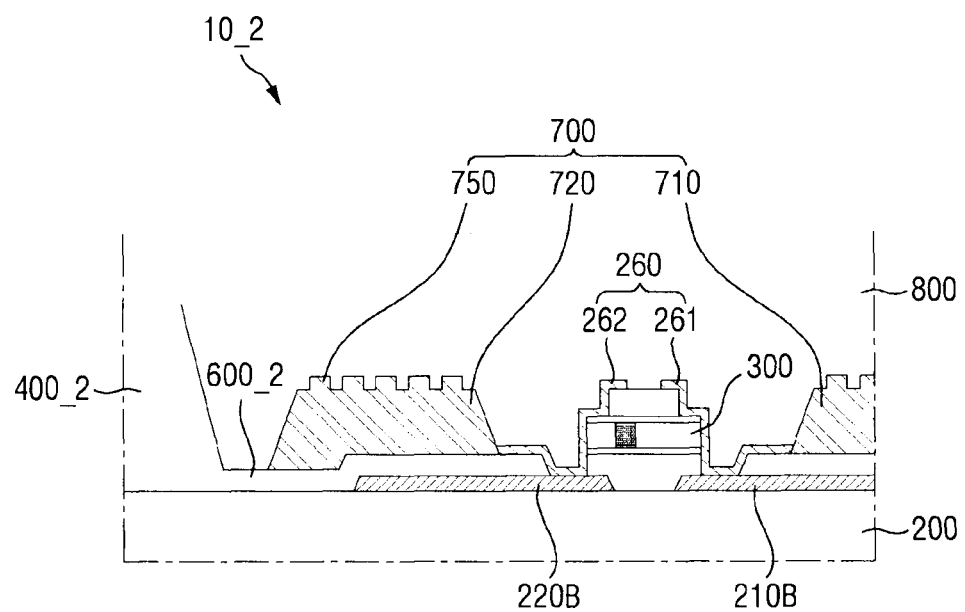
FIG. 23 and FIG. 24 are schematic cross-sectional views of a display device according to another embodiment.
Figure 24:
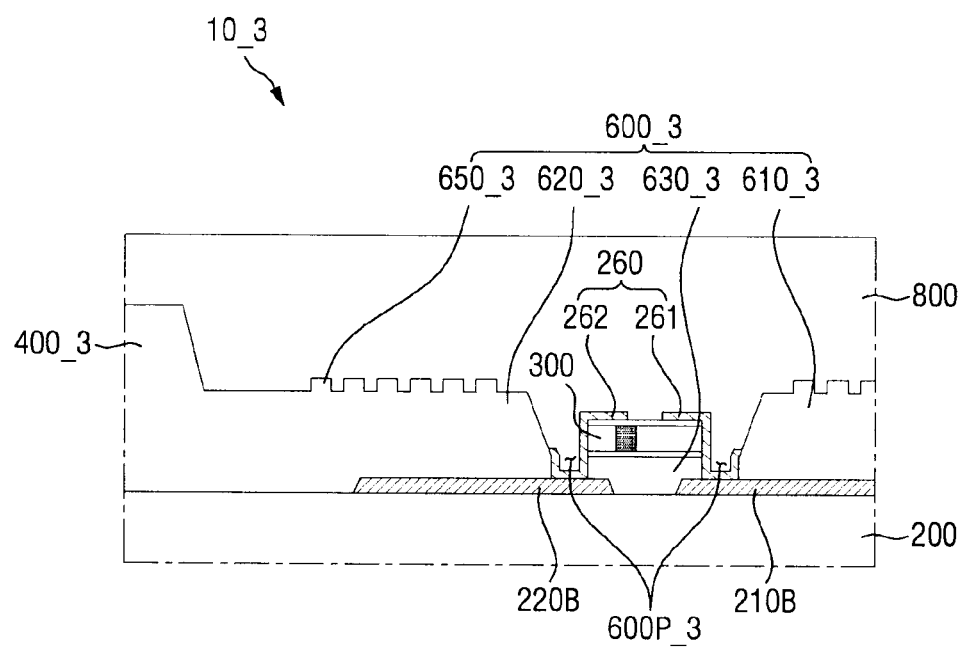

FIGS. 23 and 24 are schematic cross-sectional views of a display device according to an embodiment.

Referring to FIG. 23, in a display device 10_2 according to an embodiment, a first insulating layer 600_2 and a bank 400_2 may be formed by a same process. For example, the first insulating layer 600_2 and the bank 400_2 may be integrated into a layer. The display device 10_2 in FIG. 23 is the same as the display device 10 in FIG. 2 except that the first insulating layer 600_2 and the bank 400_2 are integrated into a single layer. Thus, repetitive descriptions thereof will be omitted.

The first insulating layer 600_2 may be formed by patterning an inorganic material or an organic insulating material, or may be formed by using a nano-imprinting method. In an embodiment, in case that the first insulating layer 600_2 is formed using the nano-imprinting method, the first insulating layer 600_2 having different steps may be formed over the substrate on which the electrodes 210 and 220 are formed. However, the disclosure is not limited thereto. The first insulating layer 600_2 having different steps (or height differences) may be formed using a slit mask or a halftone mask, and the bank 400_2 may be formed at the same time. As a result, the process of forming a separate bank 400 is omitted, so that there is an advantage in the manufacturing process of the display device 10_2.

Referring to FIG. 24, in a display device 10_3 according to an embodiment, the second insulating layer 700 may be omitted, and a first insulating layer 600_3 may include insulating patterns 610_3, 620_3, and 630_3. Unlike the first insulating layer 600 in FIG. 2, the first insulating layer 600_3 in FIG. 24 may have the insulating patterns 610_3, 620_3, and 630_3 having different steps. As described above, the first insulating layer 600_3 may be formed using a nano-imprinting method. According to an embodiment, in a process of forming the first insulating layer 600_3, some of insulating patterns 610_3, 620_3, and 630_3 may have a thickness smaller than that of the other of the insulating patterns 610_3, 620_3, and 630_3.

In an embodiment, fourth and fifth insulating patterns 610_3 and 620_3 may be spaced apart from a sixth insulating pattern 630_3 via the patterned portion 600P_3. The contact electrodes 261 and 262 may be disposed on the patterned portion 600P_3, and the contact electrodes 261 and 262 may contact the electrode branches 210B and 220B, respectively. In the display device 10_3 of FIG. 22, the second insulating layer 700 is omitted, such that portions of the first and second contact electrodes 261 and 262 on a top face of the light emitting element 300 instead of a top face of the third insulating pattern 730 are spaced apart from each other.

Further, in the display device 10_3 in FIG. 24, the first insulating layer 600_3 and a bank 400_3 may be formed by a same process. Thus, the bank 400_3 may be integral with a partial insulating pattern of the first insulating layer 600_3. Descriptions of the bank 400_3 integral with the first insulating layer 600_3 are the same as described above with reference to FIG. 23.

The first insulating layer 600_3 may include the fourth insulating pattern 610_3, the fifth insulating pattern 620_3, and the sixth insulating pattern 630_3. The fourth insulating pattern 610_3 and the fifth insulating pattern 620_3 may at least partially overlap the electrode branches 210B and 220B, respectively. The sixth insulating pattern 630_3 may be disposed between the fourth insulating pattern 610_3 and the fifth insulating pattern 620_3 and may be disposed to cover (or overlap) an end of each of the electrode branches 210B and 220B. In an embodiment, the sixth insulating pattern 630_3 may have a thickness measured in a direction smaller than that of each of the fourth insulating pattern 610_3 and the fifth insulating pattern 620_3. For example, the insulating patterns 610_3, 620_3, and 630_3 may have different vertical dimensions from the via layer 200 such that steps are formed on top sides thereof. The light emitting element 300 may be disposed on the sixth insulating pattern 630_3, which has the vertical dimension smaller than that of each of the other insulating patterns 610_3 and 620_3. The sixth insulating pattern 630_3 of FIG. 24 may correspond to a portion of the first insulating layer 600 of FIG. 2 disposed between the electrode branches 210B and 220B and spaced apart from other portions of the first insulating layer 600 via the patterned portion 600P.

In an embodiment, each of the fourth insulating pattern 610_3 and the fifth insulating pattern 620_3 may include a concave-convex pattern 650_3 in which at least a portion of a top side thereof protrudes upwards. The fourth insulating pattern 610_3 and the fifth insulating pattern 620_3 in FIG. 24 may respectively correspond to the first insulating pattern 710 and the second insulating pattern 720 in FIG. 2.

In an embodiment, as in the first insulating pattern 710 of FIG. 2, the fourth insulating pattern 610_3 may be formed such that both opposing sides thereof are respectively and horizontally spaced apart from both opposing side portions of the first electrode branch 210B while overlapping the first electrode branch 210B. A width measured in a direction of the fourth insulating pattern 610_3 may be smaller than a width of the first electrode branch 210B. The fourth insulating pattern 610_3 may be spaced apart from the sixth insulating pattern 630_3 via the patterned portion 600P_3, and at least one side of the fourth insulating pattern 610_3 may be spaced apart from the light emitting element 300.

As in the second insulating pattern 720 of FIG. 2, the fifth insulating pattern 620_3 may be formed such that a side thereof is horizontally spaced apart from a side of the second electrode branch 210B while vertically overlapping the second electrode branch 210B. However, the opposite side of the fifth insulating pattern 620_3 may be integral with the bank 400_3. Unlike the second insulating pattern 720 in FIG. 2, the fifth insulating pattern 620_3 may not be spaced apart from the bank 400_3. For example, the fifth insulating pattern 620_3 and the bank 400_3 may be integrated into a single layer.

Each of the concave-convex patterns 650_3 may be formed on at least a portion of each of top sides of the fourth insulating pattern 610_3 and the fifth insulating pattern 620_3. The concave-convex pattern 650_3 may be formed in an area thereof overlapping each of the electrode branches 210B and 220B. However, the disclosure is not limited thereto. The concave-convex pattern 650_3 formed on the fifth insulating pattern 620_3 may extend to the bank 400_3. Unlike the display device 10 in FIG. 2, the display device 10_3 of FIG. 24 is configured such that a part of an insulating pattern of the first insulating layer 600_3 may include the concave-convex pattern 650_3 positioned above the light emitting element 300 in a cross-sectional view such that the light emitted from the light emitting element 300 is incident on the fourth insulating pattern 610_3 and the fifth insulating pattern 620_3.

The display device 10_3 in FIG. 24 may include the concave-convex pattern 650_3 that provides a travel path of light emitted from the light emitting element 300, and may be free of the second insulating layer 700, and thus has an advantage in the manufacturing process of the display device 10_3.

Figure 25:
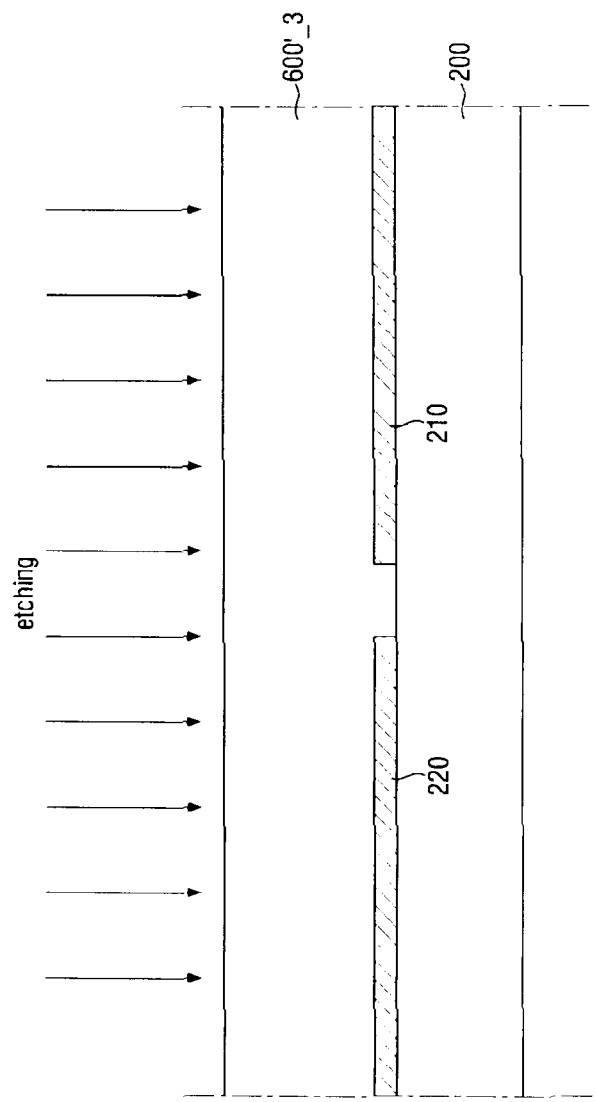
FIG. 25 to FIG. 27 are schematic cross-sectional views illustrating some steps of a manufacturing process of the display device of FIG. 24.
Figure 26:
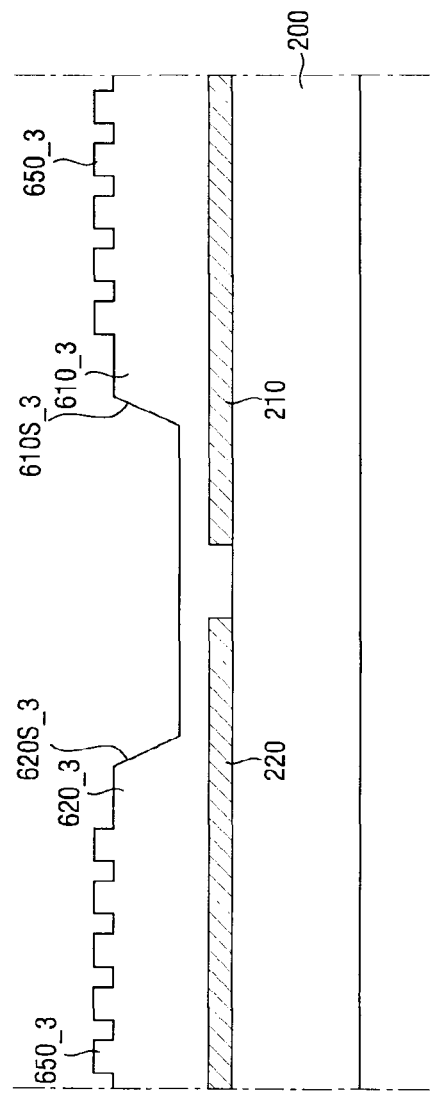
Figure 27:
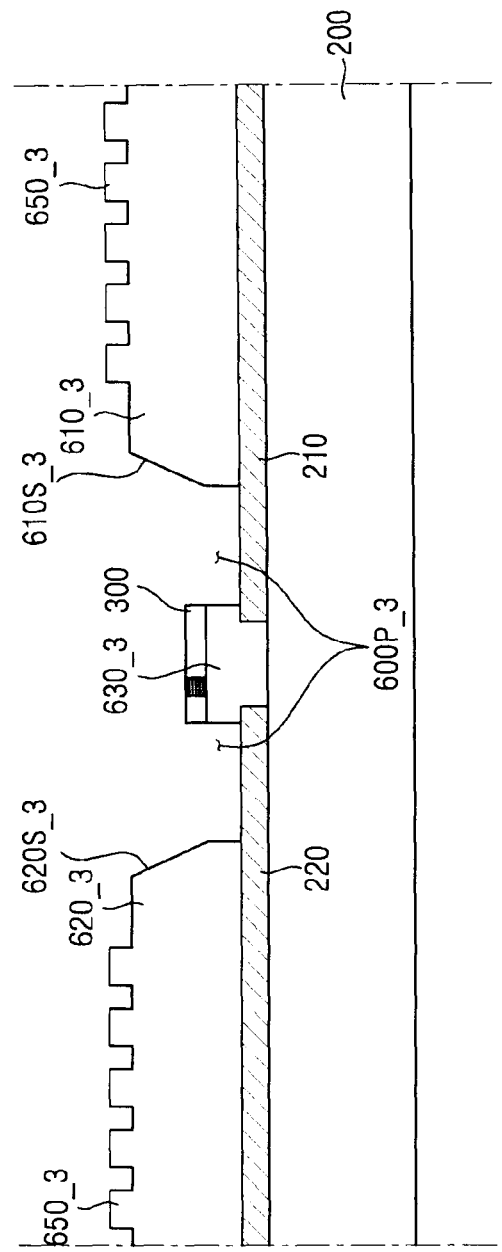

FIGS. 25 to 27 are schematic cross-sectional views illustrating some steps of the manufacturing process of the display device of FIG. 24.

In the display device 10_3 of FIG. 24, the second insulating layer 700 is omitted, and the first insulating layer 600_3 includes the insulating patterns 610_3, 620_3, and 630_3. The manufacturing process of the display device 10_3 may be free of forming the second insulating layer 700 and may include forming the first insulating layer 600_3 on the electrodes 210 and 220 and placing the light emitting element 300.

Referring to FIG. 25, the first electrode 210 and the second electrode 220 are formed on the via layer 200, and a first insulating material layer 600'_3 covering (or overlapping) an entire area thereof is formed. The first insulating material layer 600'_3 in FIG. 25 may have a relatively larger thickness, unlike the first insulating material layer 600' in FIG. 9. A portion of the first insulating material layer 600'_3 in FIG. 25 may be patterned by a subsequent process to form a space in which the light emitting element 300 is disposed.

Next, referring to FIG. 26, at least a portion of the first insulating material layer 600'_3 is patterned such that the fourth insulating pattern 610_3 and the fifth insulating pattern 620_3 respectively including the concave-convex patterns 650_3 are formed. The first insulating material layer 600'_3 may have a shape in which a portion thereof is recessed so that the fourth insulating pattern 610_3 and the fifth insulating pattern 620_3 are spaced apart from each other and face each other. The fourth insulating pattern 610_3 and the fifth insulating pattern 620_3 respectively include one sides (or first sides) 610S_3 and 620S_3 that are spaced apart from each other and face each other. Each of one side 610S_3 of the fourth insulating pattern 610_3 and one side face 620S_3 of the fifth insulating pattern 620_3 may be formed to be inclined with respect to each top side on which each concave-convex pattern 650_3 is formed. A spaced area between the fourth insulating pattern 610_3 and the fifth insulating pattern 620_3 overlaps a spaced area between the first electrode 210 and the second electrode 220. The light emitting element 300 may be placed in the spaced area between the fourth insulating pattern 610_3 and the fifth insulating pattern 620_3 by a subsequent process.

Next, referring to FIG. 27, at least one light emitting element 300 is placed in the spaced area between the fourth insulating pattern 610_3 and the fifth insulating pattern 620_3. A patterned portion 600P_3 partially exposing the first electrode 210 and the second electrode 220 is formed by etching at least a portion of the first insulating material layer 600'_3. The patterned portions 600P_3 may be respectively formed along and on both opposing sides of the light emitting element 300 disposed on the first insulating material layer 600'_3. The sixth insulating pattern 630_3 may be formed between the patterned portions 600P_3. The fourth insulating pattern 610_3 and the fifth insulating pattern 620_3 may be spaced from each other via the patterned portion 600P_3 and may be spaced from the sixth insulating pattern 630_3 via the patterned portion 600P_3.

Next, although not shown in the drawings, the first contact electrode 261 and the second contact electrode 262 disposed in the patterned portion 600P_3 are formed, and then the passivation layer 800 covering (or overlapping) the first contact electrode 261 and the second contact electrode 262 is formed. Thus, the display device 10_3 of FIG. 24 may be manufactured.

Figure 28:
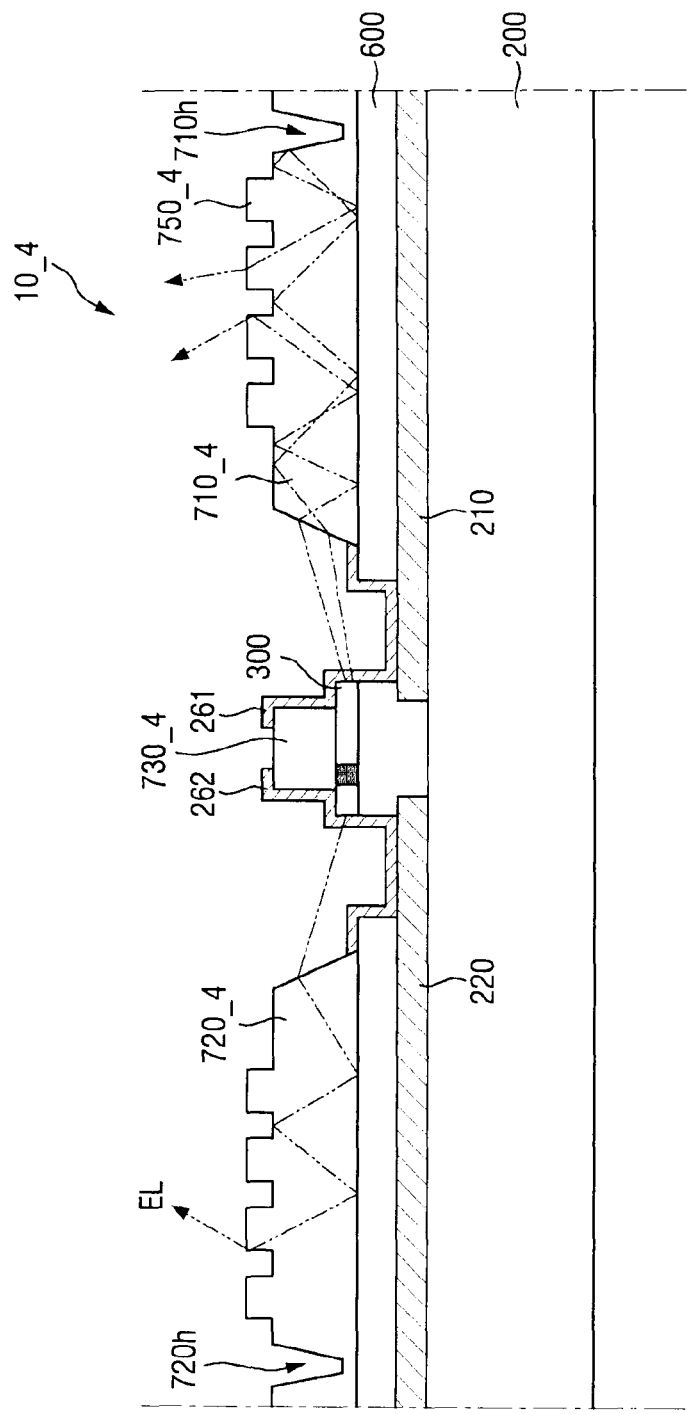
FIG. 28 is a schematic cross-sectional view of a display device according to still another embodiment.
Figure 29:
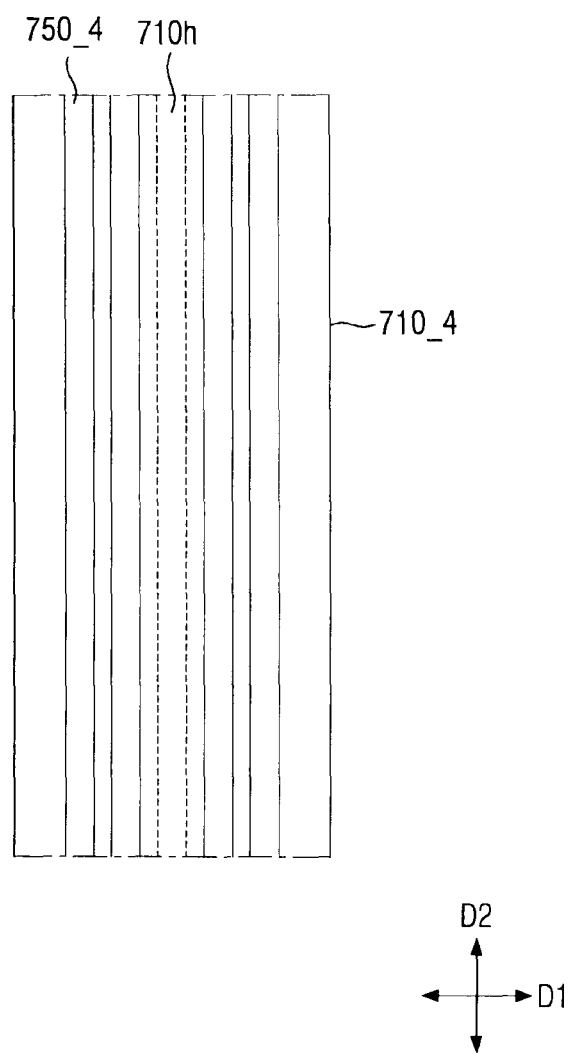
FIG. 29 and FIG. 30 are schematic plan views illustrating a hole pattern formed in an insulating pattern according to still another embodiment.
Figure 30:
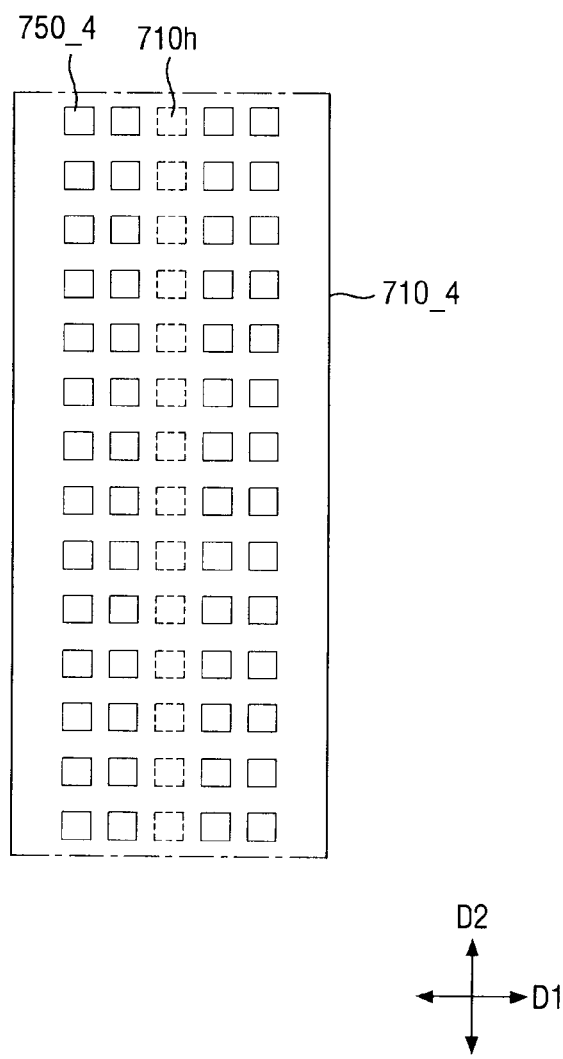

FIG. 28 is a schematic cross-sectional view of a display device according to an embodiment. FIGS. 29 and 30 are schematic plan views illustrating hole patterns formed in an insulating pattern according to an embodiment.

Referring to FIG. 28, a display device 10_4 according to an embodiment may include each of hole patterns 710$h$ and 720$h$ in which at least a portion of each of first and second insulating patterns 710_4 and 720_4 is recessed. The display device 10_4 in FIG. 28 may be different from the display device 10 in FIG. 4 at least in that each of the first and second insulating patterns 710_4 and 720_4 further includes each of the hole patterns 710$h$ and 720$h$. Hereinafter, repetitive descriptions thereof will be omitted, and descriptions will be made focusing on differences.

According to an embodiment, the first insulating pattern 710_4 and the second insulating pattern 720_4 on which the light emitted from the light emitting element 300 is incident may include at least one hole pattern 710$h$ and at least one hole pattern 720$h$, respectively. The light incident on the first insulating pattern 710_4 and the second insulating pattern 720_4 may be reflected at an interface between each of the insulating patterns and another layer and then be output through a concave-convex pattern 750_4. However, in some embodiments, some of light beams that travel in the first insulating pattern 710_4 and the second insulating pattern 720_4 may not be output through the concave-convex pattern 750_4 but may be continuously reflected in the insulating patterns and travel therein. A third insulating pattern 730_4 may be disposed on the light emitting element 300.

Although not shown in the drawing, in case that the bank 400 is integral with the second insulating layer 700, a portion of the light incident onto the second insulating pattern 720_4 may travel to a position where the bank 400 is located, and may not be output to the outside. The first insulating pattern 710_4 and the second insulating pattern 720_4 according to an embodiment may include at least one hole pattern 710$h$ and at least one hole pattern 720$h$ respectively to change a path of light traveling in the insulating pattern in order to minimize loss of the incident light. The hole patterns 710$h$ and 720$h$ may include a first hole pattern 710$h$ formed in the first insulating pattern 710_4 and a second hole pattern 720$h$ formed in the second insulating pattern 720_4. As shown in the figure, a portion of the light traveling in each of the first insulating pattern 710_4 and the second insulating pattern 720_4 may be reflected from each of the hole patterns 710$h$ and 720$h$ and then may be output through the concave-convex pattern 750_4.

Each of the hole patterns 710$h$ and 720$h$ may be formed by etching at least a portion of each of top sides of the first insulating pattern 710_4 and the second insulating pattern 720_4. Each of depths of the hole patterns 710$h$ and 720$h$ is not particularly limited. Each of depths of the hole patterns 710$h$ and 720$h$ may be smaller than a thickness of each of the first insulating pattern 710_4 and the second insulating pattern 720_4 so that the first insulating layer 600 is not exposed.

Each of both opposing sides of the first insulating pattern 710_4 may face the light emitting element 300 while being spaced apart from the light emitting element 300. The first hole pattern 710$h$ may be located at a center of the first insulating pattern 710_4. In contrast, a side of the second insulating pattern 720_4 faces the light emitting element 300, while the opposite side thereof faces the bank 400. Thus, the second hole pattern 720$h$ may be disposed adjacent to the bank 400 and in the second insulating pattern 720_4. However, the disclosure is not limited thereto. Hole patterns 710$h$ and hole patterns 720$h$ may be respectively formed in the first insulating pattern 710_4 and the second insulating pattern 720_4, respectively, and may be spaced from each other.

Referring to FIG. 29, in an embodiment, each of the hole patterns 710$h$ and 720$h$ may have a shape extending in a direction and along each of the first insulating pattern 710_4 and the second insulating pattern 720_4. Similar to the concave-convex pattern 750, each of the hole patterns 710$h$ and 720$h$ may extend in a direction (or second direction D2) in which each of the first insulating pattern 710_4 and the second insulating pattern 720_4 extends.

However, the disclosure is not limited thereto. A larger number of hole patterns 710$h$ and a larger number of hole patterns 720$h$ may be formed to define a single unit hole pattern 710$h$ and a single unit hole pattern 720$h$, respectively. Referring to FIG. 30, the hole patterns 710$h$ may be formed in the first insulating pattern 710_4 and may be spaced from each other to form a grid pattern. The hole patterns 720$h$ may be formed in the second insulating pattern 720_4 and may be spaced from each other to form a grid pattern.

Figure 31:
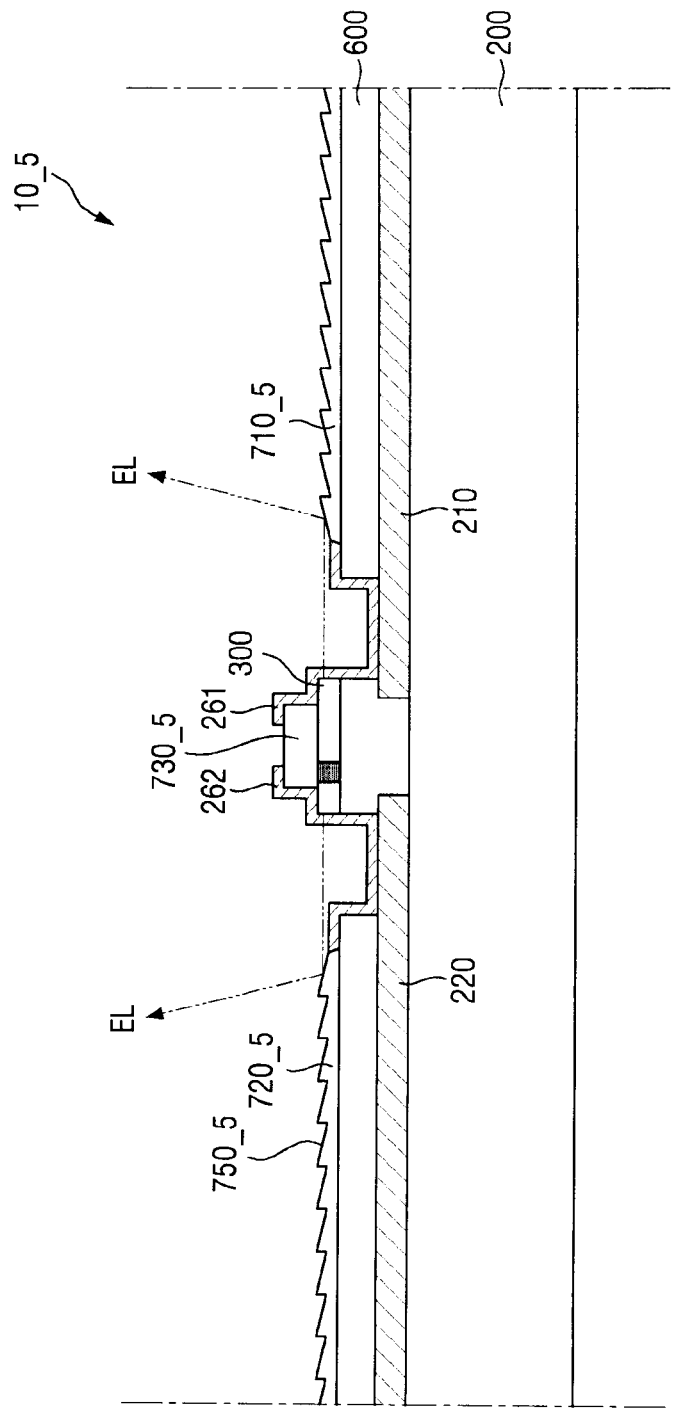
FIG. 31 is a schematic cross-sectional view of a display device according to still yet another embodiment.

FIG. 31 is a schematic cross-sectional view of a display device according to an embodiment.

Referring to FIG. 31, in a display device 10_5 according to an embodiment, the light emitting element 300 may be located above a concave-convex pattern 750_5. For example, in the display device 10_5, a vertical dimension measured from the via layer 200 to a top side of the light emitting element 300 in a cross-sectional view may be larger than a vertical dimension measured from the via layer 200 to a bottom side of the concave-convex pattern 750_5. At least a portion of the concave-convex pattern 750_5 may be located below a virtual plane parallel to a top side of the via layer 200 and flush with a top side of the light emitting element 300. A third insulating pattern 730_5 may be disposed on the light emitting elements 300.

The display device 10 according to an embodiment may include the concave-convex pattern 750 such that the light emitted from the light emitting element 300 travels toward a top of each sub-pixel PXn. In the display device 10 as described above, the light emitted from the light emitting element 300 may be incident on the first insulating layer 600 or the second insulating layer 700, may travel therein, and may be output to the outside through the concave-convex pattern 650_3 or 750. In contrast, in the display device 10_5 in FIG. 31, the light emitted from the light emitting element 300 may be not incident on the first insulating layer 600 or the second insulating layer 700, but may directly travel toward the concave-convex pattern 750_5 and then may be reflected therefrom, and may be emitted toward the top of each sub-pixel PXn.

The concave-convex pattern 750_5 of the display device 10_5 according to an embodiment may have at least one side having an inclined shape with respect to a top side of each of a first insulating pattern 710_5 and a second insulating pattern 720_5 so that the light emitted from the light emitting element 300 may be reflected thereon. The inclined side of the concave-convex pattern 750_5 has a predefined inclination angle with respect to a plane parallel to a top side of the via layer 200. Light emitted from the light emitting element 300 and traveling in a parallel direction to the top side of the via layer 200 may be reflected from the inclined side of the concave-convex pattern 750_5 and then may be mitted in an upward direction. In the display device 10_5 in FIG. 31, the light may not be incident on the insulating pattern, thereby reducing the light loss, compared to the display device 10.

In an embodiment, a structure of the light emitting element 300 is not limited to that as shown in FIG. 3 and may have a different structure.

Figure 32:
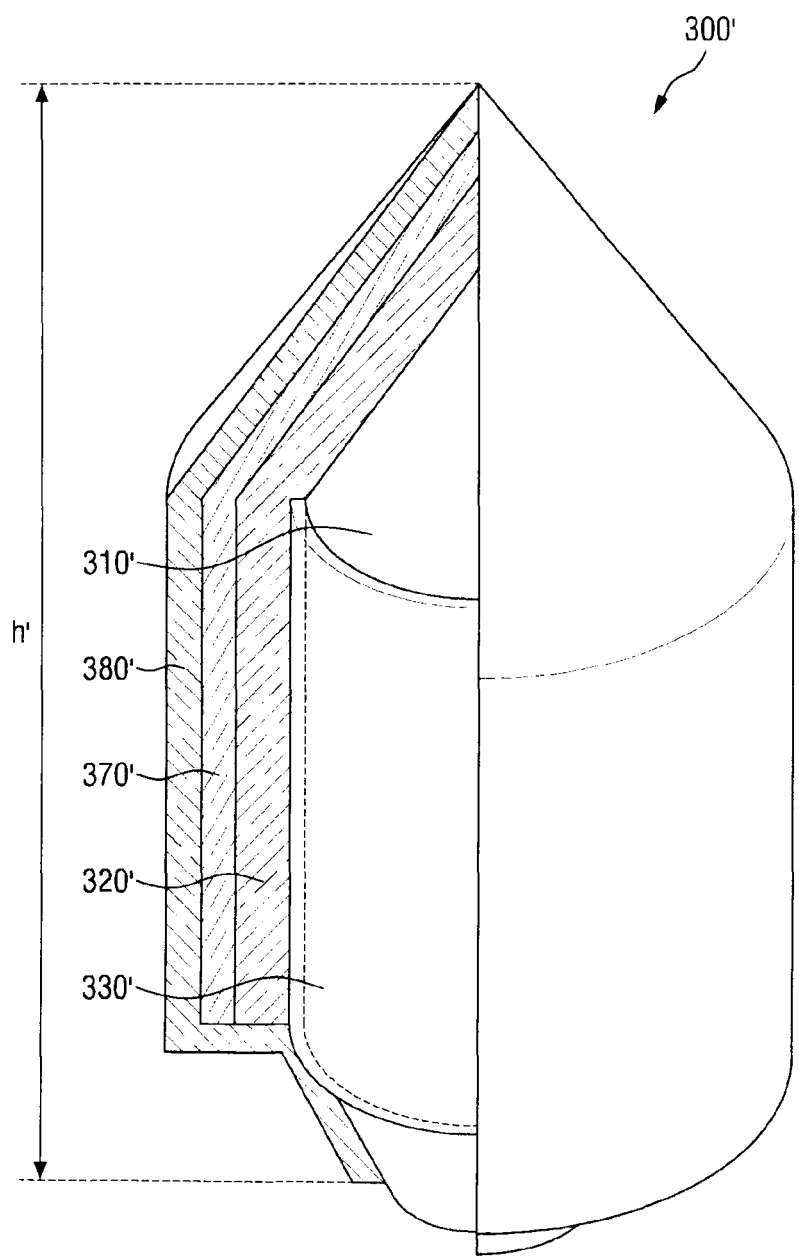
FIG. 32 is a schematic diagram of a light emitting element according to another embodiment.

FIG. 32 is a schematic diagram of a light emitting element according to an embodiment.

Referring to FIG. 32, a light emitting element 300' may be formed such that layers are not stacked in a direction, but each of the layers surrounds an outer side of adjacent another layer. The light emitting element 300' in FIG. 32 is the same as the light emitting element 300 in FIG. 3, except that a shape of each layer is different from that in the light emitting element 300 in FIG. 3. Hereinafter, the same contents will be omitted, and differences will be described.

According to an embodiment, a first conductive type semiconductor 310' may extend in a direction, and each of both opposing ends thereof may be tapered toward the centers thereof. The first conductive type semiconductor 310' in FIG. 32 may have a rod-shaped or cylindrical body, and a conical portion on each of upper and lower ends of the body. A conical portion on the upper end of the body may have a steeper slope that that of the conical portion on the lower end thereof.

An active layer 330' surrounds an outer side of the body of the first conductive type semiconductor 310'. The active layer 330' may have an annular shape extending in a direction. The active layer 330' does not surround each of the conical portions of the first conductive type semiconductor 310'. For example, the active layer 330' may contact a side of the first conductive type semiconductor 310' parallel thereto.

A second conductive type semiconductor 320' surrounds an outer side of the active layer 330' and the upper conical portion of the first conductive type semiconductor 310'. The second conductive type semiconductor 320' may include an annular body extending in a direction and an upper conical portion on an upper end of the body. For example, the second conductive type semiconductor 320' may directly contact a side of the active layer 330' parallel thereto and an inclined side of the upper conical portion of the first conductive type semiconductor 310'. However, the second conductive type semiconductor 320' does not surround the lower conical portion of the first conductive type semiconductor 310'.

An electrode material layer 370' may be disposed to surround an outer side of the second conductive type semiconductor 320'. For example, a shape of the electrode material layer 370' may be substantially the same as that of the second conductive type semiconductor 320'. For example, the electrode material layer 370' may contact an entire area of the outer side of the second conductive type semiconductor 320'.

An insulating film 380' may be disposed to surround an outer side of the electrode material layer 370' and the outer side of the first conductive type semiconductor 310'. The insulating film 380' may directly contact the outer side of the electrode material layer 370', the lower conical portion of the first conductive type semiconductor 310', and an exposed lower end of each of the active layer 330' and the second conductive type semiconductor 320'.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first electrode;
   a second electrode spaced apart from the first electrode;
   a first insulating pattern disposed on the first electrode, at least partially overlapping the first electrode, and including a first side spaced apart from a first end of the first electrode;
   a second insulating pattern disposed on the second electrode and at least partially overlapping the second electrode and including a second side facing the first side spaced apart from an end of the second electrode facing the first end of the first electrode;
   at least one concave-convex pattern disposed on each of the first insulating pattern and the second insulating pattern; and
   at least one light emitting element disposed between the first insulating pattern and the second insulating pattern and including ends electrically connected to the first electrode and the second electrode, respectively.

2. The display device of claim 1, wherein a distance between the first insulating pattern and the second insulating pattern is greater than a distance between the first electrode and the second electrode.

3. The display device of claim 2, wherein
at least a portion of a top side of each of the first insulating pattern and the second insulating pattern protrudes upwards, and
the at least one concave-convex pattern disposed on the second insulating pattern is spaced apart from the at least one concave-convex pattern disposed on the first insulating pattern.

4. The display device of claim 3, wherein a concave or convex portion of the at least one concave-convex pattern has at least one inclined outer side with respect to the top side of each of the first insulating pattern and the second insulating pattern.

5. The display device of claim 4, wherein at least a portion of the at least one concave-convex pattern is located below a plane parallel to the first electrode and intersecting the ends of the at least one light emitting element.

6. The display device of claim 3, wherein the at least one concave-convex pattern has a curved outer side.

7. The display device of claim 3, wherein
the first insulating pattern includes a first hole pattern spaced apart from the first side and formed such that at least a portion of the top side of the first insulating pattern is recessed, and
the second insulating pattern includes a second hole pattern spaced apart from the second side formed such that at least a portion of the top side of the second insulating pattern is recessed.

8. The display device of claim 7, wherein the at least one concave-convex pattern is disposed between the first hole pattern and the first side, and disposed between the second hole pattern and the second side.

9. The display device of claim 1, further comprising:
a fourth insulating pattern disposed between the first insulating pattern and the first electrode;
a fifth insulating pattern placed between the second insulating pattern and the second electrode; and
a sixth insulating pattern disposed between the fourth insulating pattern and the fifth insulating pattern, and partially overlapping each of the first end of the first electrode and the end of the second electrode.

10. The display device of claim 9, wherein the at least one light emitting element is disposed on the sixth insulating pattern.

11. The display device of claim 10, further comprising:
a first contact electrode disposed between the second insulating pattern and the sixth insulating pattern, and electrically contacting an end of the at least one light emitting element; and
a second contact electrode disposed between the fifth insulating pattern and the sixth insulating pattern, and electrically contacting another end of the at least one light emitting element.

12. The display device of claim 10, further comprising a third insulating pattern disposed between the first insulating pattern and the second insulating pattern, and disposed on at least a portion of the at least one light emitting element.

13. The display device of claim 9, further comprising a bank spaced apart from a second end of the first electrode opposite to the first end of the first electrode, wherein the first insulating pattern is spaced apart from the bank, and
the fourth insulating pattern contacts the bank.

14. The display device of claim 13, wherein a third side of the first insulating pattern opposite to the first side of the first insulating pattern is located between the bank and the second end of the first electrode.

15. The display device of claim 14, wherein a distance between the first insulating pattern and the bank is smaller than a distance between the first insulating pattern and the second insulating pattern.

16. The display device of claim 13, wherein the bank is integral with the fourth insulating pattern.

17. A display device comprising:
a first electrode extending in a first direction;
a second electrode extending in the first direction and spaced apart from the first electrode;
at least one light emitting element disposed between the first electrode and the second electrode;
a first insulating pattern extending in the first direction and partially overlapping the first electrode;
a second insulating pattern extending in the first direction and spaced apart from the first insulating pattern and overlapping the second electrode; and
at least one concave-convex pattern disposed on each of the first insulating pattern and the second insulating pattern.

18. The display device of claim 17, wherein a distance between the first insulating pattern and the second insulating pattern is greater than a distance between the first electrode and the second electrode.

19. The display device of claim 18, wherein
a first side portion of the first insulating pattern is horizontally spaced inward from an end of the first electrode, and
a second side portion of the first insulating pattern opposite to the first side portion horizontally protrudes outward beyond another end of the first electrode.

20. The display device of claim 19, wherein two side portions of the second insulating pattern are horizontally spaced inward from two ends of the second electrode, respectively.

21. The display device of claim 19, wherein the at least one concave-convex pattern extends in a second direction and spaced apart from each other in a third direction different from the second direction.

22. The display device of claim 21, wherein
the first insulating pattern includes a first hole pattern in which at least a portion of a top side of the first insulating pattern is recessed toward the first electrode,
the second insulating pattern includes a second hole pattern in which at least a portion of a top side of the second insulating pattern is recessed toward the second electrode, and
each of the first hole pattern and the second hole pattern extends in the first direction.

23. The display device of claim 22, wherein
the at least one concave-convex pattern disposed on the first insulating pattern is disposed between the first side portion and the first hole pattern, and
the at least one concave-convex pattern disposed on the second insulating pattern is disposed between each of side portions of the second insulating pattern and the second hole pattern.

* * * * *